(12) United States Patent
Ahn

(10) Patent No.: US 6,852,167 B2
(45) Date of Patent: Feb. 8, 2005

(54) METHODS, SYSTEMS, AND APPARATUS FOR UNIFORM CHEMICAL-VAPOR DEPOSITIONS

(75) Inventor: Kie Y. Ahn, Chappaqua, NY (US)

(73) Assignee: Micron Technology, Inc., Boise, ID (US)

(*) Notice: Subject to any disclaimer, the term of this patent is extended or adjusted under 35 U.S.C. 154(b) by 211 days.

(21) Appl. No.: 09/797,324

(22) Filed: Mar. 1, 2001

(65) Prior Publication Data

US 2002/0122885 A1 Sep. 5, 2002

(51) Int. Cl.$^7$ .............................................. C23C 16/00
(52) U.S. Cl. ....................................................... 118/715
(58) Field of Search ......................................... 118/715

(56) References Cited

U.S. PATENT DOCUMENTS

| | | | |
|---|---|---|---|
| 3,381,114 A | * 4/1968 | Nakanuma | 219/385 |
| 3,407,479 A | 10/1968 | Fordemwall et al. | 29/577 |
| 3,457,123 A | 7/1969 | Van Pul | 148/1.5 |
| 3,471,754 A | 10/1969 | Hoshi et al. | 317/235 |
| 3,689,357 A | 9/1972 | Jordan | 161/119 |
| 4,051,354 A | 9/1977 | Choate | 235/312 |
| 4,058,430 A | 11/1977 | Suntola et al. | 427/255.13 |
| 4,215,156 A | 7/1980 | Dalal et al. | 427/84 |
| 4,292,093 A | 9/1981 | Ownby et al. | 148/4 |
| 4,305,640 A | 12/1981 | Cullis et al. | 350/96.1 |
| 4,333,808 A | 6/1982 | Bhattacharyya et al. | 204/192 D |
| 4,399,424 A | 8/1983 | Rigby | 338/34 |
| 4,413,022 A | 11/1983 | Suntola et al. | 427/255.2 |
| 4,590,042 A | * 5/1986 | Drage | 422/186.06 |
| 4,604,162 A | 8/1986 | Sobczak | 156/657 |
| 4,647,947 A | 3/1987 | Takeoka et al. | 346/135.1 |
| 4,663,831 A | 5/1987 | Birrittella et al. | 29/576 E |
| 4,673,962 A | 6/1987 | Chatterjee et al. | 357/23.6 |
| 4,761,768 A | 8/1988 | Turner et al. | 365/201 |
| 4,766,569 A | 8/1988 | Turner et al. | 365/185 |
| 4,767,641 A | * 8/1988 | Kieser et al. | 427/569 |
| 4,894,801 A | 1/1990 | Saito et al. | 365/154 |

(List continued on next page.)

FOREIGN PATENT DOCUMENTS

| | | | |
|---|---|---|---|
| JP | 62-199019 | * 9/1987 | |
| JP | 5-090169 | * 9/1993 | |
| JP | 07-320996 | 12/1995 | H01L/21/02 |
| JP | 09-293845 | 11/1997 | H01L/21/322 |
| JP | 11-335849 | * 12/1999 | |
| JP | 2001-332546 | 11/2001 | H01L/21/316 |
| WO | WO 02/33729 A2 | * 4/2002 | |

OTHER PUBLICATIONS

Ahn, Kie Y., et al., "Highly Reliable Amorphous High–K Gate Oxide ZrO2", *Micron Docket No. 01–0516*, (May 17, 2001),3 pages.

(List continued on next page.)

*Primary Examiner*—Jeffrie R. Lund
(74) *Attorney, Agent, or Firm*—Schwegman, Lundberg, Woessner & Kluth, P.A.

(57) ABSTRACT

Integrated circuits, the key components in thousands of electronic and computer products, are generally built layer by layer on a silicon substrate. One common technique for forming layers is called chemical-vapor deposition (CVD.) Conventional CVD systems not only form layers that have non-uniform thickness, but also have large chambers that make the CVD process wasteful and slow. Accordingly, the inventor devised new CVD systems, methods, and apparatuses. One exemplary CVD system includes an outer chamber, a substrate holder, and a unique gas-distribution fixture. The fixture includes a gas-distribution surface having holes for dispensing a gas and a gas-confinement member that engages or cooperates with the substrate holder to form an inner chamber within the outer chamber. The inner chamber has a smaller volume than the outer chamber, which not only facilitates depositions of more uniform thickness, but also saves gas and speeds up the deposition process.

47 Claims, 4 Drawing Sheets

U.S. PATENT DOCUMENTS

| | | | |
|---|---|---|---|
| 4,920,071 A | 4/1990 | Thomas | 437/188 |
| 4,920,396 A | 4/1990 | Shinohara et al. | 357/42 |
| 4,948,937 A | 8/1990 | Blank et al. | 219/121.6 |
| 4,962,879 A | 10/1990 | Goesele et al. | 228/116 |
| 4,987,089 A | 1/1991 | Roberts | 437/34 |
| 4,993,358 A * | 2/1991 | Mahawili | 118/715 |
| 5,001,526 A | 3/1991 | Gotou | 357/23.6 |
| 5,006,192 A * | 4/1991 | Deguchi | 156/345.44 |
| 5,017,504 A | 5/1991 | Nishimura et al. | 437/40 |
| 5,021,355 A | 6/1991 | Dhong et al. | 437/35 |
| 5,028,977 A | 7/1991 | Kenneth et al. | 357/43 |
| 5,032,545 A | 7/1991 | Doan et al. | 437/242 |
| 5,080,928 A | 1/1992 | Klinedinst et al. | 427/70 |
| 5,089,084 A | 2/1992 | Chhabra et al. | 438/706 |
| 5,097,291 A | 3/1992 | Suzuki | 355/69 |
| 5,102,817 A | 4/1992 | Chatterjee et al. | 437/47 |
| 5,110,752 A | 5/1992 | Lu | 437/47 |
| 5,122,856 A | 6/1992 | Komiya | 357/55 |
| 5,156,987 A | 10/1992 | Sandhu et al. | 437/40 |
| 5,177,028 A | 1/1993 | Manning | 437/41 |
| 5,198,029 A | 3/1993 | Dutta et al. | 118/303 |
| 5,202,278 A | 4/1993 | Mathews et al. | 437/47 |
| 5,208,657 A | 5/1993 | Chatterjee et al. | 257/302 |
| 5,223,081 A | 6/1993 | Doan | 156/628 |
| 5,266,514 A | 11/1993 | Tuan et al. | 437/52 |
| 5,320,880 A | 6/1994 | Sandhu et al. | 427/578 |
| 5,324,980 A | 6/1994 | Kusunoki | 257/74 |
| 5,327,380 A | 7/1994 | Kersh, III et al. | 365/195 |
| 5,376,575 A | 12/1994 | Kim et al. | 437/52 |
| 5,391,911 A | 2/1995 | Beyer et al. | 257/522 |
| 5,392,245 A | 2/1995 | Manning | 365/200 |
| 5,393,704 A | 2/1995 | Huang et al. | 437/203 |
| 5,396,093 A | 3/1995 | Lu | 257/306 |
| 5,410,169 A | 4/1995 | Yamamoto et al. | 257/301 |
| 5,414,287 A | 5/1995 | Hong | 257/316 |
| 5,414,288 A | 5/1995 | Fitch et al. | 257/328 |
| 5,416,041 A | 5/1995 | Schwalke | 437/62 |
| 5,421,953 A | 6/1995 | Nagakubo et al. | 216/34 |
| 5,422,499 A | 6/1995 | Manning | 257/67 |
| 5,438,009 A | 8/1995 | Yang et al. | 437/52 |
| 5,440,158 A | 8/1995 | Sung-Mu | 257/314 |
| 5,441,591 A | 8/1995 | Imthurn et al. | 156/153 |
| 5,445,986 A | 8/1995 | Hirota | 437/60 |
| 5,455,445 A | 10/1995 | Kurtz et al. | 257/419 |
| 5,460,316 A | 10/1995 | Hefele | 228/39 |
| 5,460,988 A | 10/1995 | Hong | 437/43 |
| 5,466,625 A | 11/1995 | Hsieh et al. | 437/52 |
| 5,483,094 A | 1/1996 | Sharma et al. | 257/316 |
| 5,483,487 A | 1/1996 | Sung-Mu | 365/185.33 |
| 5,492,853 A | 2/1996 | Jeng et al. | 437/60 |
| 5,495,441 A | 2/1996 | Hong | 365/185.01 |
| 5,497,017 A | 3/1996 | Gonzales | 257/306 |
| 5,504,357 A | 4/1996 | Kim et al. | 257/306 |
| 5,504,376 A | 4/1996 | Sugahara et al. | 257/768 |
| 5,508,219 A | 4/1996 | Bronner et al. | 437/52 |
| 5,508,542 A | 4/1996 | Geiss et al. | 257/301 |
| 5,528,062 A | 6/1996 | Hsieh et al. | 257/298 |
| 5,593,912 A | 1/1997 | Rajeevakumar | 437/52 |
| 5,595,606 A | 1/1997 | Fujikawa et al. | 118/725 |
| 5,614,026 A * | 3/1997 | Williams | 118/723 ME |
| 5,616,934 A | 4/1997 | Dennison et al. | 257/67 |
| 5,640,342 A | 6/1997 | Gonzalez | 365/156 |
| 5,644,540 A | 7/1997 | Manning | 365/200 |
| 5,646,900 A | 7/1997 | Tsukude et al. | 365/205 |
| 5,674,574 A | 10/1997 | Atwell et al. | 427/561 |
| 5,691,230 A | 11/1997 | Forbes | 437/62 |
| 5,698,022 A | 12/1997 | Glassman et al. | |
| 5,710,057 A | 1/1998 | Kenney | 437/62 |
| 5,735,960 A * | 4/1998 | Sandhu et al. | 118/723 IR |
| 5,756,404 A | 5/1998 | Friedenreich et al. | 438/791 |
| 5,789,030 A | 8/1998 | Rolfson | 429/309 |
| 5,795,808 A | 8/1998 | Park | 438/301 |
| 5,801,105 A | 9/1998 | Yano et al. | 438/785 |
| 5,810,923 A | 9/1998 | Yano et al. | 117/84 |
| 5,822,256 A | 10/1998 | Bauer et al. | 365/200 |
| 5,828,080 A | 10/1998 | Yano et al. | 257/43 |
| 5,840,897 A | 11/1998 | Kirlin et al. | 546/2 |
| 5,892,249 A | 4/1999 | Courtright et al. | 257/209 |
| 5,916,365 A | 6/1999 | Sherman | 117/92 |
| 5,950,925 A * | 9/1999 | Fukunaga et al. | 239/132.3 |
| 5,963,833 A | 10/1999 | Thakur | 438/677 |
| 5,994,240 A | 11/1999 | Thakur | 438/758 |
| 6,013,553 A | 1/2000 | Wallace et al. | 438/287 |
| 6,020,024 A | 2/2000 | Maiti et al. | 427/248.1 |
| 6,025,627 A | 2/2000 | Forbes et al. | 257/321 |
| 6,027,960 A | 2/2000 | Kusumoto et al. | 438/166 |
| 6,027,961 A | 2/2000 | Maiti et al. | 438/199 |
| 6,057,271 A | 5/2000 | Kenjiro et al. | 505/475 |
| 6,059,885 A * | 5/2000 | Ohashi et al. | 118/730 |
| 6,093,623 A | 7/2000 | Forbes | 438/455 |
| 6,093,944 A | 7/2000 | VanDover | 257/310 |
| 6,110,529 A | 8/2000 | Gardiner et al. | 427/250 |
| 6,114,252 A | 9/2000 | Donohoe et al. | 438/710 |
| 6,120,531 A | 9/2000 | Zhou et al. | 607/111 |
| 6,127,287 A | 10/2000 | Hurley et al. | 438/791 |
| 6,143,582 A | 11/2000 | Vu et al. | 438/30 |
| 6,161,500 A * | 12/2000 | Kopacz et al. | 118/723 E |
| 6,165,837 A | 12/2000 | Kawakubo et al. | 438/244 |
| 6,171,900 B1 | 1/2001 | Sun | 438/240 |
| 6,184,146 B1 | 2/2001 | Donohoe et al. | 438/710 |
| 6,187,484 B1 | 2/2001 | Glass et al. | 430/5 |
| 6,194,262 B1 | 2/2001 | Noble | 438/253 |
| 6,203,613 B1 | 3/2001 | Gates et al. | 117/104 |
| 6,206,972 B1 * | 3/2001 | Dunham | 118/715 |
| 6,211,035 B1 | 4/2001 | Moise et al. | 438/396 |
| 6,211,039 B1 | 4/2001 | Noble | 438/412 |
| 6,218,293 B1 | 4/2001 | Kraus et al. | 438/644 |
| 6,225,168 B1 | 5/2001 | Gardner et al. | 438/287 |
| 6,234,535 B1 | 5/2001 | Roberts | 156/630 |
| 6,274,479 B1 | 8/2001 | Srinivasan | 438/632 |
| 6,281,144 B1 * | 8/2001 | Cleary et al. | 438/780 |
| 6,290,491 B1 * | 9/2001 | Shahvandi et al. | 432/5 |
| 6,291,314 B1 | 9/2001 | Henley et al. | 438/458 |
| 6,294,813 B1 | 9/2001 | Forbes et al. | 257/321 |
| 6,297,539 B1 | 10/2001 | Ma et al. | 257/410 |
| 6,302,964 B1 * | 10/2001 | Umotoy et al. | 118/715 |
| 6,303,481 B2 | 10/2001 | Park | 438/591 |
| 6,303,500 B1 | 10/2001 | Jiang et al. | 438/678 |
| 6,313,035 B1 | 11/2001 | Sandhu et al. | 438/681 |
| 6,317,175 B1 | 11/2001 | Salerno et al. | 349/45 |
| 6,331,465 B1 | 12/2001 | Forbes et al. | 438/260 |
| 6,342,445 B1 | 1/2002 | Marsh | 438/681 |
| 6,348,386 B1 | 2/2002 | Gilmer | 438/288 |
| 6,365,519 B2 | 4/2002 | Kraus et al. | 438/688 |
| 6,368,941 B1 | 4/2002 | Chen et al. | 438/424 |
| 6,380,579 B1 | 4/2002 | Nam et al. | 257/306 |
| 6,387,712 B1 | 5/2002 | Yano et al. | 438/3 |
| 6,391,769 B1 | 5/2002 | Lee et al. | 438/643 |
| 6,420,230 B1 | 7/2002 | Derderian et al. | 438/255 |
| 6,420,279 B1 | 7/2002 | Ono et al. | 438/785 |
| 6,432,779 B1 | 8/2002 | Hobbs et al. | 438/287 |
| 6,436,203 B1 * | 8/2002 | Kaizuka et al. | 148/512 |
| 6,444,039 B1 * | 9/2002 | Nguyen | 118/715 |
| 6,444,042 B1 * | 9/2002 | Yang et al. | 118/724 |
| 6,444,895 B1 | 9/2002 | Nikawa | 136/212 |
| 6,445,023 B1 | 9/2002 | Vaartstra et al. | 257/295 |
| 6,448,192 B1 | 9/2002 | Kaushik | 438/785 |
| 6,451,641 B1 | 9/2002 | Halliyal et al. | 438/200 |
| 6,451,695 B2 | 9/2002 | Sneh | 438/685 |
| 6,458,701 B1 | 10/2002 | Chae et al. | 438/680 |
| 6,461,436 B1 | 10/2002 | Campbell et al. | 118/715 |

| | | | |
|---|---|---|---|
| 6,461,970 B1 | 10/2002 | Yin | 438/710 |
| 6,465,334 B1 | 10/2002 | Buynoski et al. | 438/591 |
| 6,472,321 B2 | 10/2002 | Srinivasan et al. | 438/680 |
| 6,482,740 B2 | 11/2002 | Soininen et al. | 438/686 |
| 6,495,436 B2 | 12/2002 | Ahn et al. | 438/591 |
| 6,498,063 B1 | 12/2002 | Ping | 438/253 |
| 6,506,666 B2 | 1/2003 | Marsh | 438/484 |
| 6,514,348 B2 * | 2/2003 | Miyamoto | 118/715 |
| 6,514,828 B2 | 2/2003 | Ahn et al. | 438/297 |
| 6,518,610 B2 | 2/2003 | Yang et al. | 257/295 |
| 6,521,911 B2 | 2/2003 | Parsons et al. | 257/52 |
| 6,524,867 B2 | 2/2003 | Yang et al. | 438/3 |
| 6,524,901 B1 | 2/2003 | Trivedi | 438/183 |
| 6,533,867 B2 * | 3/2003 | Doppelhammer | 118/715 |
| 6,534,357 B1 | 3/2003 | Basceri | 438/239 |
| 6,534,420 B2 | 3/2003 | Ahn et al. | 438/768 |
| 6,537,613 B1 | 3/2003 | Senzaki et al. | 427/250 |
| 6,541,353 B1 | 4/2003 | Sandhu et al. | 438/478 |
| 6,544,875 B1 | 4/2003 | Wilk | 438/591 |
| 6,551,893 B1 | 4/2003 | Zheng et al. | |
| 6,559,472 B2 | 5/2003 | Sandhu et al. | 257/31 |
| 6,573,199 B2 | 6/2003 | Sandhu et al. | 438/798 |
| 6,586,792 B2 | 7/2003 | Ahn et al. | 257/295 |
| 6,592,661 B1 | 7/2003 | Thakur et al. | 117/2 |
| 6,593,610 B2 | 7/2003 | Gonzalez | 257/296 |
| 6,596,583 B2 | 7/2003 | Agarwal et al. | 438/255 |
| 6,596,636 B2 | 7/2003 | Sandhu et al. | 438/676 |
| 6,602,338 B2 | 8/2003 | Chen et al. | 106/287.19 |
| 6,608,378 B2 | 8/2003 | Ahn et al. | 257/701 |
| 6,613,656 B2 | 9/2003 | Li | 438/584 |
| 6,613,702 B2 | 9/2003 | Sandhu et al. | 438/798 |
| 6,617,634 B2 | 9/2003 | Marsh et al. | 60/276 |
| 6,627,260 B2 | 9/2003 | Derderian et al. | 427/301 |
| 6,642,567 B1 | 11/2003 | Marsh | 257/306 |
| 6,656,371 B2 | 12/2003 | Drewes | 216/22 |
| 6,656,835 B2 | 12/2003 | Marsh et al. | 438/650 |
| 6,660,660 B2 | 12/2003 | Haukka et al. | 438/778 |
| 6,661,058 B2 | 12/2003 | Ahn et al. | 257/344 |
| 6,670,284 B2 | 12/2003 | Yin | 438/759 |
| 6,673,701 B1 | 1/2004 | Marsh et al. | 438/493 |
| 6,677,250 B2 | 1/2004 | Campbell et al. | 438/758 |
| 6,683,005 B2 | 1/2004 | Sandhu et al. | 438/715 |
| 6,713,846 B1 | 3/2004 | Senzaki | 257/635 |
| 2001/0002582 A1 * | 6/2001 | Dunham | 118/715 |
| 2001/0009383 A1 | 7/2001 | Nakayama et al. | 326/121 |
| 2001/0009695 A1 | 7/2001 | Saanila et al. | 427/255.39 |
| 2001/0010957 A1 | 8/2001 | Forbes et al. | 438/248 |
| 2002/0001971 A1 | 1/2002 | Cho | 438/765 |
| 2002/0024080 A1 | 2/2002 | Derderian et al. | 257/301 |
| 2002/0025628 A1 | 2/2002 | Derderian et al. | 438/253 |
| 2002/0046705 A1 | 4/2002 | Sandhu et al. | 118/719 |
| 2002/0086507 A1 | 7/2002 | Park et al. | 438/585 |
| 2002/0086555 A1 | 7/2002 | Ahn et al. | 438/783 |
| 2002/0089023 A1 | 7/2002 | Yu et al. | 257/411 |
| 2002/0089063 A1 | 7/2002 | Ahn et al. | 257/762 |
| 2002/0090806 A1 | 7/2002 | Ahn et al. | 438/618 |
| 2002/0100418 A1 | 8/2002 | Sandhu et al. | 118/719 |
| 2002/0102818 A1 | 8/2002 | Sandhu et al. | 438/479 |
| 2002/0110991 A1 | 8/2002 | Li | 438/387 |
| 2002/0122885 A1 * | 9/2002 | Ahn | 427/255.28 |
| 2002/0130338 A1 | 9/2002 | Ahn et al. | 257/295 |
| 2002/0146916 A1 | 10/2002 | Irino et al. | 438/785 |
| 2002/0155688 A1 | 10/2002 | Ahn et al. | 438/592 |
| 2002/0155689 A1 | 10/2002 | Ahn et al. | 29/76 |
| 2002/0164420 A1 | 11/2002 | Derderian et al. | 248/427 |
| 2002/0167089 A1 | 11/2002 | Ahn et al. | 257/762 |
| 2002/0192974 A1 | 12/2002 | Ahn et al. | 438/722 |
| 2002/0195056 A1 | 12/2002 | Sandhu et al. | 118/719 |
| 2003/0001212 A1 | 1/2003 | Hu | 257/388 |
| 2003/0003730 A1 | 1/2003 | Li | 438/680 |
| 2003/0008243 A1 | 1/2003 | Ahn et al. | 430/314 |
| 2003/0017717 A1 | 1/2003 | Ahn et al. | 438/768 |
| 2003/0020169 A1 | 1/2003 | Ahn et al. | 257/762 |
| 2003/0020180 A1 | 1/2003 | Ahn et al. | 257/786 |
| 2003/0042526 A1 | 3/2003 | Weimer | 257/309 |
| 2003/0045082 A1 | 3/2003 | Eldridge et al. | 438/593 |
| 2003/0048666 A1 | 3/2003 | Eldridge et al. | 365/185.28 |
| 2003/0052356 A1 | 3/2003 | Yang et al. | 257/309 |
| 2003/0052358 A1 | 3/2003 | Weimer | 257/310 |
| 2003/0089314 A1 * | 5/2003 | Matsuki et al. | 118/715 |
| 2003/0102501 A1 | 6/2003 | Yang et al. | 257/295 |
| 2003/0119313 A1 | 6/2003 | Yang et al. | 438/681 |
| 2003/0157764 A1 | 8/2003 | Ahn et al. | 438/212 |
| 2003/0159653 A1 | 8/2003 | Dando et al. | 118/715 |
| 2003/0170389 A1 | 9/2003 | Sandhu | 427/255.28 |
| 2003/0170403 A1 | 9/2003 | Doan et al. | 427/569 |
| 2003/0175411 A1 | 9/2003 | Kodas et al. | 427/58 |
| 2003/0181039 A1 | 9/2003 | Sandhu et al. | 438/685 |
| 2003/0183156 A1 | 10/2003 | Dando et al. | 117/84 |
| 2003/0194861 A1 | 10/2003 | Mardian et al. | 438/680 |
| 2003/0194862 A1 | 10/2003 | Mardian | 438/680 |
| 2003/0203626 A1 | 10/2003 | Derderian et al. | 438/689 |
| 2003/0207032 A1 * | 11/2003 | Ahn et al. | 427/255.34 |
| 2003/0207540 A1 | 11/2003 | Ahn et al. | 438/287 |
| 2003/0207564 A1 | 11/2003 | Ahn et al. | 438/638 |
| 2003/0207593 A1 | 11/2003 | Derderian | 438/778 |
| 2003/0209324 A1 * | 11/2003 | Fink | 156/345.48 |
| 2003/0222300 A1 | 12/2003 | Basceri et al. | 257/309 |
| 2003/0227033 A1 | 12/2003 | Ahn et al. | 257/213 |
| 2003/0228747 A1 | 12/2003 | Ahn et al. | 438/591 |
| 2004/0004244 A1 | 1/2004 | Ahn et al. | 257/314 |
| 2004/0004245 A1 | 1/2004 | Forbes et al. | 237/315 |
| 2004/0004247 A1 | 1/2004 | Forbes et al. | 257/324 |
| 2004/0004859 A1 | 1/2004 | Forbes et al. | 365/185.05 |
| 2004/0033701 A1 | 2/2004 | Ahn et al. | 438/785 |
| 2004/0065255 A1 | 4/2004 | Yang et al. | 118/715 |

OTHER PUBLICATIONS

Alen, Petra, "Atomic Layer deposition of Ta(Al)N(C) thin films using trimethylaluminum as a reducing agent", *Journal of the Electrochemical Society*, 148(10), (Oct. 2001), G566–G571.

Bendoraitis, J.G., et al., "Optical energy gaps in the monoclinic oxides of hafnium and zirconium and their solid solutions", *Journal of Physical Chemistry*, 69(10), (1965), 3666–3667.

Bright, A.A., et al., "Low–rate plasma oxidation of Si in a dilute oxygen/helium plasma for low–temperature gate quailty Si/Sio2 interfaces", *Applied Physics Letters*, 58(6), (Feb. 1991),619–621.

Bunshah, Rointan F., et al., "Deposition Technologies for Films and Coatings: Developments and Applications", *Park Ridge, N.J., U.S.A. : Noves Publications*, (1982),102–103.

Cava, R J., et al., "Improvement of the dielectric properties of Ta/sub 2/O/sub 5/ through substitution with Al/sub 2/O/sub 3/", *Applied Physics Letters*, 70(11), (Mar. 1997),1396–8.

De Flaviis, Franco , et al., "Planar microwave integrated phase–shifter design with high purity ferroelectric material", *IEEE Transactions on Microwave Theory & Techniques*, 45(6), (Jun. 1997),963–969.

Dusco, C , et al., "Deposition of tin oxide into porous silicon by atomic layer epitaxy", *Journal of the Electrochemical Society*, 143, (1996),683–687.

El–Kareh, B , et al., "The evolution of DRAM cell technology", *Solid State Technology*, 40(5), (1997),89–90, 92, 95–6, 98, 100–1.

Forsgren, K., *Comprehensive Summaries of Uppsala Dissertation from the Faculty of Science and Technology*, 665, (2001),37.

Fuyuki, Takashi, et al., "Initial stage of ultra–thin SiO/sub 2/ formation at low temperatures using activated oxygen", *Applied Surface Science*, 117–118, (Jun. 1997), 123–126.

Gusev, EP., et al., "Ultrathin High–K Dielectrics Grown by Atomic Layer Deposition: A Comparative Study of ZrO2, HfO2, Y2O3 and Al2O3", *Electrochemical Society Proceedings* vol. 2001–9, (2001), 189–195.

Gutowski, M J., "Thermodynamic stability of high–K dielectric metal oxides ZrO/sub 2/ and HfO/sub 2/ in contact with Si and SiO/sub 2/", *Applied Physics Letters*, 80(11), (Mar. 18, 2002), 1897–1899.

Jeon; Sanghun, et al., "Excellent electrical characteristics of lanthanide (Pr, Nd, Sm, Gd, and Dy) oxide and lanthanide–doped oxide for MOS gate dielectric applications", *Electron Devices Meeting, 2001. IEDM Technical Digest International*, (2001),471–474.

Kawai, Y, et al., "Ultra–low–temperature growth of high–integrity gate oxide films by low–energy Ion–assisted oxidation", *Applied Physics Letters*, 64(17), (Apr. 1994), 2223–2225.

Kim, Byoung–Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001),7.8.1–7.8.6.

Kim, Taeseok, et al., "Correlation between strain and dielectric properties in ZrTiO/sub 4/ thin films", *Applied Physics Letters*, 76(21), (May 2000),3043–3045.

Kim, Taeseok, et al., "Dielectric properties and strain analysis in paraelectric ZrTiO/sub 4/ thin films deposited by DC magnetron sputtering", *Japanese Journal of Applied Physics Part 1—Regular Papers Short Notes & Review Papers*, vol. 39, No. 7A, (2000),4153–4157.

Kim, Yongjo, et al., "Effect of microstructures on the microwave dielectric properties of ZrTiO/sub 4/ thin films", *Applied Physics Letters*, 78(16), (Apr. 2001),2363–2365.

Kim, Y, et al., "Substrate dependence on the optical properties of Al/sub 2/O/sub 3/ films grown by atomic layer deposition", *Applied Physics Letters*, 71(25, 22), (Dec. 1997),3604–3606.

Kukli, K, et al., "Comparison of hafnium oxide films grown by atomic layer deposition from Iodide and chloride precursors", *Thin Solid Films*, 416, (2002),72–79.

Kukli, K, et al., "Influence of thickness and growth temperature on the properties of zirconium oxide films growth by atomic layer deposition on silicon", *Thin Solid Films*, 410, (2002),53–60.

Kukli, Kaupo, et al., "Low–Temperature Deposition of Zirconium Oxide–Based Nanocrystalline Films by Alternate Supply of Zr[OC(CH3)3]4 and H2O", *Chemical Vapor Deposition*, 6(6), (2000),297–302.

Kukli, K J., et al., "Properties of hafnium oxide films grown by atomic layer deposition from hafnium tetraiodide and oxygen", *Journal of Applied Physics*, 92(10), (Nov. 15, 2002),5698–5703.

Lee, C. H., et al., "MOS Characteristics of Ultra Thin Rapid Thermal CVD ZrO2 and Zr Silicate Gate Dielectrics", *Electron Devices Meeting, 2000. IEDM Technical Digest International*, (2000),27–30.

Lee, C H., et al., "MOS Devices with High Quality Ultra Thin CVD ZrO2 Gate Dielectrics and Self–Aligned TaN and TaN/Poly–Si Gate electrodes", *2001 Symposium on VLSI, Technology Digest of Technical Papers*, (2001), 137–138.

Lee, Byoung H., et al., "Ultrathin Hafnium Oxide with Low Leakage and Excellent Reliability for Alternative Gate Dielectric Application", *Technical Digest of IEDM*, (1999), 133–136.

Liu, Y C., et al., "Growth of ultrathin SiO/sub 2/ on Si by surface irradiation with an O/sub 2/+Ar electron cyclotron resonance microwave plasma at low temperatures", *Journal of Applied Physics*, 85(3), (Feb. 1999), 1911–1915.

Luo, Z J., et al., "Ultra–thin ZrO2 (or Silicate) with High Thermal Stability for CMOS GAte Applications", *2001 Symposium on VLSI Technology Digest of Technical Papers*, (2001), 135–136.

Martin, P J., et al., "Ion–beam–assisted deposition of thin films", *Applied Optics*, 22(1), (Jan. 1983), 178–184.

Nakajima, Anri, et al., "Atomic–layer deposition of ZrO/sub 2/ with a Si nitride barrier layer", *Applied Physics Letters*, vol. 81, No. 15, (Oct. 2002),2824–2826.

Niilisk, A, "Atomic–scale optical monitoring of the initial growth of TiO2 thin films", *Proceedings of the SPIE—The International Society for Optical Engineering*, 4318, (2001), 72–77.

Oates, D E., et al., "Surface impedance measurements of YBa/sub 2/Cu/Sub 3/O/sub 7–x/ thin films in stripline resonators", *IEEE Transactions on Magnetics*, vol. 27, No. 2, pt. 2, (Mar. 1991),867–871.

Pan, Tung M., et al., "High quality ultrathin CoTiO/sub 3/ high–k gate dielectrics", *Electrochemical and Solid–State Letters*, 3(9), (Sep. 2000),433–434.

Pan, Tung M., et al., "High–k cobalt–titanium oxide dielectrics formed by oxidation of sputtered Co/Ti or Ti/Co films", *Applied Physics Letters*, 78(10), (Mar. 5, 2001),1439–1441.

Poveshchenko, V P., et al., "Investigation of the phas composition of films of zirconium, hafnium and yttrium oxides", *Soviet Journal of Optical Technology*, 51(5), (1984),277–279.

Rahtu, Antti, et al., "Atomic Layer Deposition of Zicronium Titanium Oxide from Titanium Isopropoxide and Zirconium Chloride", *Chemistry of Materials*, 13(5), (May 2001), 1525–1532.

Robertson, J., "Band offsets of wide–band–gap oxides and implications for future electronic devices", *Journal of Vacuum Science & Technology B (Microelectronics and Nanometer Structures)*, 18(3), (May–Jun. 2000),1785–1791.

Rossnagel, S M., "Plasma–enhanced atomic layer depostion of Ta and Ti for Interconnect diffusion barriers", *Journal of Vacuum Science & Technology B (Microelectronics and Nanometer Structures)*, 18(4), (Jul. 2000),2016–2020.

Sze, S M., "Physics of Semiconductor Devices", *New York:Wiley*, (1981),431.

Sze, S M., "Physics of Semiconductor Devices", *New York:Wiley*, (1981),473.

Wolf, S., et al., *In: Silicon Processing of the VLSI Era*, vol. 1, Lattice Press,374–380.

Wolf, Stanley, et al., "Silicon Processing for the VLSI Era—vol. I: Process Technology", *Second Edition, Lattice Press*, Sunset Beach, California,(2000),443.

Wolfram, G, et al., "Existence range, structural and dielectric properties of ZrxTiySnzO4 ceramics (x + y =2)", *Materials Research Bulletin*, 16(11), (Nov. 1981), 1455–63.

Yamaguchi, Takeshi, et al., "Band Diagram and Carrier Conduction Mechanism in ZrO2/Zr–silicate/Si MIS Structure Fabricated by Pulsed–laser–ablation Deposition", *Electron Devices Meeting, 2000. IEDM Technical Digest International*, (2000), 19–22.

Yamaguchi, Takeshi, et al., "Study on Zr–Silicate Interfacial Layer of ZrO2–MIS Structure FAbricated by Pulsed Laser Ablation Deposition Method", *Solid State Devices and Materials*, (2000),228–229.

Zhang, H, et al., "High permittivity thin film nanolaminates", *Journal of Applied Physics*, 87(4), (Feb. 2000), 1921–1924.

Zhu, W, et al., "HfO2 and HfAlO for CMOS: Thermal Stability and Current Tranport", *IEEE International Electron Device Meeting 2001*, (2001),463–466.

Nakajima, Anri, "Soft breakdown free atomic–layer–deposited silicon–nitride/SiO$_2$ stack gate dielectrics", *International Electron Devices Meeting, Technical Digest*, (2001), 6.5.1–4.

*International Technology for Semiconductor Roadmap*, Semiconductor Industry Association, http://public.itrs.net/Files/2001ITRS/Links/1999_SIA_Roadmap/,(1999).

Aarik, Jaan, et al., "Atomic layer growth of epitaxial TiO/sub 2/ thin films from TiCl/sub 4/ and H/sub 2/O on alpha –Al/sub 2/O/sub 3/ substrates", *Journal of Crystal Growth*, 242(1–2), (2002), 189–198.

Aarik, Jaan, et al., "Influence of substrate temperature on atomic layer growth and properties of HfO/sub 2/ thin films", *Thin Solid Films*, 340(1–2), (1999),110–116.

Aarik, Jaan, et al., "Phase transformations in hafnium dioxide thin films grown by atomic layer doposition at high temperatures", *Applied Surface Science*.

Aarik, Jaan, et al., "Texture development in nanocrystalline hafnium dioxide thin films grown by atomic layer deposition", *Journal of Crystal Growth*, (2000), pp. 105–113.

Cheng, Baohong, et al., "The Impact of High–k Gate Dielectrics and Metal Gate Electrodes on Sub–100nm MOSFET's", *IEEE Transactions on Electron Devices*, (1999), pp. 1537–1544.

Copel, M., et al., "Structure and stability of ultrathin zirconium oxide layers on Si(001)", *Applied Physics Letters*, vol. 76, No. 4,(Jan. 24, 2000),pp. 436–438.

Desu, S.B., "Minimization of Fatigue in Ferroelectric Films", *Phys. Stat. Sol. (a)* 151, (1995), pp. 467–480.

Fuyuki, Takashi, et al., "Electronic Properties of the Interface between Si and TiO2 Deposited at Very Low Temperatures", *Journal of Applied Physics*, (1986),pp. 1288–1291.

Gartner, M, et al., "Spectroellipsometric characterization of lanthanide–doped TiO2 films obtained via the sol–gel technique", *Thin Solid Films*, (1993),pp. 561–565.

Geller, S., et al., "Crystallographic Studies of Perovskitelike Compounds. II. Rare Earth Aluminates", *Acta Cryst.* vol. 9, (May 29, 1956),pp. 1019–1025.

Giess, E. A., et al., "Lanthanide gallate perovskite–type substrates for epitaxial, high–Tc superconducting Ba2YCu3O7—films", *IBM J. Res. Develop.* vol. 34, No. 6, (Nov. 6, 1990),pp. 916–926.

Hirayama, Masaki, et al., "Low–Temperature Growth of High–Integrity Silicon Oxide Films by Oxygen Radical Generated in High Density Krypton Plasma", *IEDM Technical Digest*, (1999), pp. 249–252.

Hubbard, K. J., et al., "Thermodynamic stability of binary oxides in contact with silicon", *J. Mater. Res.*, (Nov. 1996), pp. 2757–2776.

Iddles, D. M., et al., "Relationships between dopants, microstructure and the microwave dielectric properties of ZrO2–TiO2–SnO2 ceramics", *Journal of Materials Science*, vol. 27,(1992),pp. 6303–6310.

Jeong, Chang–Wook, et al., "Plasma–Assisted Atomic Layer Growth of High–Quality Aluminum Oxide Thin Films", *Japanese Journal of Applied Physics*, (Jan. 2001), pp. 285–289.

Keomany, D, et al., "Sol gel preparation of mixedcerium–titanium oxide thin films", *Solar Energy Materials and Solar Cells*, (1994),pp. 429–441.

Kim, C T., et al., "Application of Al2O3 Grown by Atomic Layer Deposition to DRAM and FeRAM", *International Symposium in Integrated Ferroelectrics*, (Mar. 2000),pp. 316.

Kim, D., et al., "Atomic Control of Substrate Termination and Heteroepitaxial Growth of SrTiO3/LaAlO3 Films", *Journal of the Korean Physical Society* vol. 36 No. 6, (Jun. 2000), pp. 444–448.

Kim, Y, et al., "Substrate dependence on the optical properties of Al2O3 films grown by atomic layer deposition", *Applied Physics Letters*, (Dec. 1997),pp. 3604–3606.

Kukli, Kaupo, et al., "Atomic Layer Deposition of Titanium Oxide Til4 and H2O2", *Chem. Vap. Deposition*, vol. 6, No. 6,(2000),pp. 303–310.

Kukli, K, et al., "Controlled Growth of Yttrium Oxysulphide Thin Films by Atomic Layer Deposition", *Materials Science Forum*, (1999),pp. 216–221.

Kukli, Kaupo, et al., "Dielectric Properties of Zirconium Oxide Grown by Atomic Layer Deposition from Iodide Precursor", *Journal of The Electrochemical Society*, 148(12),(2001),pp. F227–F232.

Lee, A. E., et al., "Epitaxially grown sputtered LaAlO3 films", *Appl. Phys. Lett.* 57(19), (Nov. 5, 1990),pp. 2019–2021.

Lee, Cheng–Chung, et al., "Ion–assisted deposition of silver thin films", *Thin Solid Films*, (2000),pp. 95–97.

Lee, Dong H., et al., "Metalorganic chemical vapor deposition of Tio2:n anatase thin film on Si substrate", *Applied Physics Letters*, (Feb. 1995),pp. 815–816.

Lee, L. P., et al., "Monolithic 77 K dc SQUID magnetometer", *Appl. Phys. Lett.* 59(23), (Dec. 2, 1991),pp. 3051–3053.

Leskela, M, et al., "ALD precursor chemistry: Evolution and future challenges", *Journal de Physique*, (1999),pp. 837–852.

Liu, C. T., "Circuit Requirement and Integration Challenges of Thin Gate Dielectrics for Ultra Small MOSFET's", *IEDM*, (1998), pp. 747–750.

Lucovsky, G, et al., "Microscopic model for enhanced dielectric constants in low concentration SiO2–rich noncrystalline Zr and Hf silicate alloys", *Applied Physics Letters*, (Oct. 2000),pp. 2912–2914.

Molodyk, A. A., et al., "Volatile Surfactant–Assisted MOCVD: Application to LaAl03 Thin Film Growth", *Chem. Vap. Deposition* vol. 6, No. 3, (2000),pp. 133–138.

Molsa, Heini, et al., "Growth of Yttrium Oxide Thin Films from B–Diketonate Precursor", *Advanced Materials for Optics and Electronics*, (1994),pp. 389–400.

Muller, D. A., "The electronic structure at the atomic scale of ultrathin gate oxides", *Nature*, vol. 399, No. 6738, Jun. 24, 1999, (1999), pp. 758–761.

Nakagawara, Osamu, et al., "Electrical properties of (Zr, Sn)TiO4 dielectric thin film prepared by pulsed laser deposition", *J. Appl. Phys.*, 80(1),(Jul. 1, 1996),pp. 388–392.

Nakajima, Anri, et al., "NH3–annealed atomic–layer–deposited silicon nitride as a high–k gate dielectric with high reliability", *Applied Physics Letters*, (Feb. 2002),pp. 1252–1254.

Neumayer, D A., et al., "Materials characterization of ZrO2–SiO2 and HfO2–SiO2 binary oxides deposited by chemical solution deposition", *Journal of Applied Physics*, (Aug. 2001),pp. 1801–1808.

Nieminen, Minna, et al., "Formation and stability of lanthanum oxide thin films deposited from B–diketonate precursor", *Applied Surface Science*, (2001),pp. 155–165.

Ohring, Milton, "The Materials Science of Thin Films", *Academic Press Inc.*, (1992), pp. 118, 121, 125.

Osten, H. J., et al., "High–k Gate Dielectrics with Ultra–low Leakage Current Based on Praseodymium Oxide", *IEEE*, (2000),653–656.

Park, Byung–Eun, et al., "Electrical properties of LaAlO3/Si and Sr0.8Bi2.2Ta2O9/LaAlO3/Si structures", *Applied Physics Letters*, vol. 79, No. 6,(Aug. 6, 2001),pp. 806–808.

Perkins, Charles M., et al., "Electrical and materials properties of ZrO2 gate dielectrics grown by atomic layer chemical vapor deposition", *Applied Physics Letters*, vol. 78, No. 16,(Apr. 16, 2001),pp. 2357–2359.

Qi, Wen–Jie, et al., "MOSCAP and MOSFET characteristics using ZrO2 gate dielectric deposited directly on Si", *IEDM Technical Digest*, (1999), pp. 145–148.

Qi, Wen–Jie, et al., "Performance of MOSFETs with ultra thin ZrO2 and Zr–silicate gate dielectrics", *IEEE*, (2000),pp. 40–41.

Ramakrishnan, E. S., et al., "Dielectric Properties of Radio Frequency Magnetron Sputter Deposited Zirconium Titanate–Based Thin Films", *J. Electrochem. Soc.*, vol. 145, No. 1,(Jan., 1998),pp. 358–362.

Rayner Jr., G, et al., "The Structure of Plasma–Deposited and Annealed Pseudo–Binary ZrO2–SiO2 Alloys", *Material Res. Soc. Symp.*, (2000),pp. C1.3.1–C1.3.9.

Ritala, Mikko, "Atomic Layer Epitaxy Growth of Titanium, Zirconium and Hafnium Dioxide Thin Films", *Annales Academiae Scientiarum Fennicae*, (1994),pp. 24–25.

Ritala, Mikko, et al., "Zirconium dioxide thin films deposited by ALE using zirconium tetrachloride as precursor", *Applied Surface Science*, vol. 75,(1994),pp. 333–340.

Rotondaro, A L., et al., "Advanced CMOS Transistors with a Novel HfSiON Gate Dielectric", *Symposium on VLSI Technology Digest of Technical Papers*, (2002),pp. 148–149.

Saito, Yuji, et al., "Advantage of Radical Oxidation for Improving Reliability of Ultra–Thin Gate Oxide", *2000 Symposium on VLSI Technology Digest of Technical Papers*, (2000), pp. 176–177.

Saito, Yuji, et al., "High–Integrity Silicon Oxide Grown at Low–Temperature by Atomic Oxygen Generated in High-Density Krypton Plasma", *Extended Abstracts of the 1999 International Conference on Solid State Devices and Materials*, (1999), pp. 152–153.

Shanware, A, et al., "Reliability evaluation of HfSiON gate dielectric film with 12.8 A SiO2 equivalent thickness", *International Electron Devices Meeting*, (2001),pp. 137–140.

Shin, Chang H., et al., "Fabrication and Characterization of MFISFET using Al2O3 Insulating Layer for Non–Volatile Memory", *12th International Symposium in Integrated Ferroelectrics*, (Mar. 2000), pp. 1–9.

Sneh, Ofer, et al., "Thin film atomic layer deposition equipment for semiconductor processing", *Thin Solid Films*, (2002),pp. 248–261.

Song, Hyun–Jung, et al., "Atomic Layer Deposition of Ta2O5 Films Using Ta(OC2H5)5 and NH3", *Mat. Res. Soc. Symp. Proc.*, (1999),pp. 469–471.

Takemoto, J. H., et al., "Microstrip Resonators and Filters Using High–TC Superconducting Thin Films on LaAlO3", *IEEE Transactions on Magnetics*, vol. 27, No. 2, (Mar., 1991),pp. 2549–2552.

Tarre, A., et al., "Comparative study of low–temperature chloride atomic–layer chemical vapor deposition of TiO2 and SnO2", *Applied Surface Science*, (2001),pp. 111–116.

Van Dover, R B., "Amorphous lanthanide–doped TiOx dielectrics films", *Applied Physics Letters*, (May 1999),pp. 3041–3043.

Van Dover, Robert B., et al., "Deposition of Uniform Zr–Sn–Ti–O films by ON–Axis Reactive Sputtering", *IEEE Electron Device Letters*, vol. 19, No. 9,(Sep., 1998),pp. 329–331.

Van Dover, R. B., et al., "Discovery of a useful thin–film dielectric using a composition–spread approach", *Letters to Nature*, (1997),3 pages.

Viirola, H, et al., "Controlled growth of antimony–doped tin dioxide thin films by atomic layer epitaxy", *Thin Solid Films*, (1994),pp. 127–135.

Viirola, H, et al., "Controlled growth of tin oxide thin films by atomic layer epitaxy", *Thin Solid Films*, (1994),pp. 144–149.

Visokay, M R., et al., "Application of HfSiON as a gate dielectric materials", *Applied Physics Letters*, (Apr. 2002), pp. 3183–3185.

Wilk, G D., et al., "Hafnium and zirconium silicates for advanced gate dielectrics", *Journal of Applied Physics*, (Jan. 2000),pp. 484–492.

Wilk, G. D., et al., "High–K gate dielectrics: Current status and materials properties considerations", *J. Appl. Phys.*, vol. 89, No. 10, (May 15, 2001),pp. 5243–5275.

Zhang, H., "Atomic Layer Deposition of High Dielectric Constant Nanolaminates", *Journal of The Electrochemical Society*, 148(4),(Apr., 2001), pp. F63–F66.

Engelhardt, M., "Modern Applications of Plasma Etching and Patterning in Silicon Process Technology", *Contrib. Plasma. Phys.*, 39(5), pp. 473–478, (1999).

Hunt, C.E., et al., "Direct bonding of micromachined silicon wafers for laser diode heat exchanger applications", *J. Micromech. Microeng.*, 1, pp. 152–156, (1991).

Krauter, G., et al., "Room Temperature Silicon Wafer Bonding with Ultra–Thin Polymer Films", *Advanced Materials*, 6(5), pp. 417–420, (1997).

Suntola, T., "Atomic Layer Epitaxy", *Handbook of Crystal Growth, 3; Thin Films of Epitaxy, Part B: Growth Mechanics and Dynamics*, Amsterdam, pp. 601–663, (1994).

Suntola, T., "Atomic layer epitaxy", *Thin Solid Films*, 216, pp. 84–89, (1992).

Zucker, O., et al., "Application of Oxygen Plasma Processing to Silicon Direct Bonding", *Sensors and Actuators A*, 36, pp. 227–231, (1993).

Copy of PCT Search Report dated Oct. 15, 2003 for application PCT/US 03/17730 completed by S. Nesso.

"Improved Metallurgy for Wiring Very Large Scale Integrated Circuits", *International Technology Disclosures*, 4, Abstract,(1986),1 page.

Abe, T , "Silicon Wafer–Bonding Process Technology for SOI Structures", *Extended Abstracts of the 22nd (1990 International) Conference on Solid State Devices and Materials*, (1990),853–856.

Adler, E. , et al., "The Evolution of IBM CMOS DRAM Technology", *IBM Journal of Research & Development*, 39(1–2), (Jan.–Mar. 1995), 167–188.

Asai, S. , "Technology Challenges for Integration Near and Below 0.1 micrometer", *Proceedings of the IEEE*, 85(4), Special Issue on Nanometer–Scale Science & Technology, (Apr. 1997),505–520.

Auberton–Herve, A. J., "SOI: Materials to Systems", *Digest of the International Electron Device Meeting*, San Francisco,(Dec. 1996),3–10.

Banerjee, S. K., et al., "Characterization of Trench Transistors for 3–D Memories", *1986 Symposium on VLSI Technology, Digest of Technical Papers*, San Diego, CA,(May 1986),79–80.

Bengtsson, Stefan , et al., "Interface charge control of directly bonded silicon structures", *J. Appl. Phys.*, 66(3), (Aug. 1989), 1231–1239.

Blalock, T. N., et al., "A High–Speed Sensing Scheme for 1T Dynamic RAM's Utilizing the Clamped Bit–Line Sense Amplifier", *IEEE Journal of Solid–State Circuits*, 27(4), (Apr. 1992),pp. 618–624.

Bomchil, G. , "Porous Silicon: The Material and its Applications in Silicon–On–Insulator Technologies", *Applied Surface Science*, 41/42, (1989),604–613.

Burnett, D. , "Implications of Fundamental Threshold Voltage Variations for High–Density SRAM and Logic Circuits", *1994 Symposium on VLSI Technology Digest of Technical Papers*, Honolulu, HI,(Jun. 1994),15–16.

Burnett, D. , "Statistical Threshold–Voltage Variation and its Impact on Supply–Voltage Scaling", *Proceedings SPIE: Microelectronic Device and Multilevel Interconnection Technology*, 2636, (1995),83–90.

Callegari, A. , et al., "Physical and electrical characterization of Hafnium oxide and Hafnium silicate sputtered films", *Journal of Applied Physics*, 90(12), (Dec. 15, 2001),6466–75.

Cartagena, E , "Bonded Etchback Silicon on Sapphire Bipolar Junction Transistors", *Extended Abstracts—Electrochemical Society (1)*, Program and Abstracts: 183rd Meeting of the Electrochemical Society, Pennington, NJ,(1993), 1199–1200.

Chang, Hyo S., et al., "Excellent thermal stability of $Al_2O_3/ZrO_2/Al_2O_3$ stack structure of metal–oxide–semiconductor gate dielectrics application", *Applied Physics Letters*, 80(18), (May 6, 2002),3385–7.

Chen, M. J., et al., "Back–Gate Forward Bias Method for Low–Voltage CMOS Digital Circuits", *IEEE Transactions on Electron Devices*, 43, (Jun. 1996),904–909.

Chen, M. J., et al., "Optimizing the Match in Weakly Inverted MOSFET's by Gated Lateral Bipolar Action", *IEEE Transactions on Electron Devices*, 43, (May 1996), 766–773.

Chen, P. J., et al., "Thermal stability and scalability of Zr–aluminate–based high–k gate stacks", *Symposium on VLSI Technology Digest*, (2002), 192–3.

Chesler, R. , et al., "Solid–State Ionic Lasers", *In: Laser Handbook*, vol. 1, Arecchi, F.T., et al., (eds.), North–Holland Publishing Company, Amsterdam,(1972),p. 353.

Chung, I. Y., et al., "A New SOI Inverter for Low Power Applications", *Proceedings of the 1996 IEEE International SOI Conference*, Sanibel Island, FL,(1996),20–21.

Clark, P , "IMEC Highlights Hafnium, Metal Gates for High–k Integration", *Semiconductor Business News*, at Silicon Strategies.com,(Oct. 11, 2002),2 pages.

Colombo, D. , et al., "Anhydrous Metal Nitrates as Volatile Single Source Precursors for the CVD of Metal Oxide Films", *Communications, Department of EE, U of M, Mpls, MN*, (Jul. 7, 1998),3 pages.

Conley Jr., J F., et al., "Atomic Layer Deposition of Hafnium Oxide Using Anhydrous Hafnium Nitrate", *Electrochemical and Solid State Letters*, 5(5), (2002),C57–C59.

Da Rosa, E B., et al., "Annealing of $ZrAl_xO_y$ Ultrathin Films on Si in a Vacuum or in $O_2$", *Journal of the Electrochemical Society*, 148 (12), (Dec. 2001),G695–G703.

De, V. K., "Random MOSFET Parameter Fluctuation Limits to Gigascale Integration (GSI)", *1996 Symposium on VLSI Technology, Digest of Technical Papers*, Honolulu, HI,(Jun. 11–13, 1996), 198–199.

Denton, J. P., et al., "Fully Depleted Dual–Gated Thin–Film SOI P–MOSFET's Fabricated in SOI Islands with an Isolated Buried Polysilicon Backgate", *IEEE Electron Device Letters*, 17(11), (Nov. 1996),pp. 509–511.

Ding, "Copper Barrier, Seed Layer and Planerization Technologies", *VMIC Conference Proceedings*, (1997),87–92.

Fong, Y. , "Oxides Grown on Textured Single–Crystal Silicon—Dependence on Process and Application in EEPROMs", *IEEE Transactions on Electron Devices*, 37(3), (Mar. 1990),pp. 583–590.

Forbes, L. , et al., "Resonant Forward–Biased Guard–Ring Diodes for Suppression of Substrate Noise in Mixed–Mode CMOS Circuits", *Electronics Letters*, 31, (Apr. 1995),720–721.

Forsgren, Katarina , "CVD and ALD of Group IV–and V–Oxides for Dielectric Applications", *Comprehensive Summaries of Uppsala Dissertation from the Faculty of Science and Technology*, 665, (2001).

Foster, R. , et al., "High Rate Low–Temperature Selective Tungsten", *In: Tungsten and Other Refractory Metals for VLSI Applications III*, V.A. Wells, ed., Materials Res. Soc., Pittsburgh, PA,(1988),69–72.

Fuse, T. , "A 0.5V 200MHz 1–Stage 32b ALU Using a Body Bias Controlled SOI Pass–Gate Logic", *1997 IEEE International Solid–State Circuits Conference, Digest of Technical Papers*, (1997),286–287.

Gagliano, F. P., et al., "Laser Processing Fundamentals", *In Lasers in Industry*, edited by S.S. Charschan, Van Nostrand Reinhold Company,(1972),156–164.

Gong, S. , "Techniques for reducing switching noise in high speed digital systems", *Proceedings Eighth Annual IEEE International ASIC Conference and Exhibit*, (1995),21–24.

Gosele, U. , et al., "Self–propagating Room–temperature Silicon Wafer Bonding in Ultrahigh Vacuum", *Applied Physics Letters*, 67(24), (Dec. 11, 1995),3614–3616.

Guillaumot, B , et al., "75 nm damascene metal gate and high–k integration for advanced CMOS devices", *Technical Digest of International Electron Devices Meeting 2002*, (2002),355–358.

Hao, M. Y., "Electrical Characteristics of Oxynitrides Grown on Textured Single–Crystal Silicon", *Appl. Phys. Lett.*, 60, (Jan. 1992),445–447.

Harada, M., "Suppression of Threshold Voltage Variation in MTCMOS/SIMOX Circuit Operating Below 0.5 V", *1996 Symposium on VLSI Technology, Digest of Technical Papers*, Honolulu, HI,(Jun. 11–13, 1996),96–97.

Harendt, Christine, "Silicon on Insulator Material by Wafer Bonding", *Journal of Electronic Materials*, 20(3), (Mar. 1991),267–77.

Hayashi, H., et al., "Fabrication of Low–temperature bottom–gate Poly–Si TFTs on large–area substrate by linear–beam excimer laser crystallization and ion doping method", *IEEE IEDM*, vol. 95, (1995),829–832.

Heavens, O., *Optical Properties of Thin Solid Films*, Dover Pubs. Inc., New York,(1965),155–206.

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C.,(Dec. 8–11, 1991),959–961.

Hodges, David A., et al., "MOS Decoders", *In: Analysis and Design of Digital Integrated Circuits, 2nd Edition*, Section: 9.1.3,(1988),354–357.

Holman, W. T., et al., "A Compact Low Noise Operational Amplifier for a 1.2 Micrometer Digital CMOS Technology", *IEEE Journal of Solid–State Circuits*, 30, (Jun. 1995).710–714.

Horiuchi, M, et al., "A mechanism of silicon wafer bonding", *of the First International Symposium on Semiconductor Wafer Bonding: Science, Technology and Applications*, (1996),48–62.

Hu, G., "Will Flash Memory Replace Hard Disk Drive?", *1994 IEEE International Electron Device Meeting*, Panel Discussion, Session 24, Outline,(Dec. 1994),2 pages.

Huang, W. L., et al., "TFSOI Complementary BiCMOS Technology for Low Power Applications", *IEEE Transactions on Electron Devices*, 42, (Mar. 1995),506–512.

Iijima, T., "Microstructure and Electrical Properties of Amorphous W–Si–N Barrier Layer for Cu Interconnections", *1996 VMIC Conference*, (1996),168–173.

Imthurn, George P., et al., "Bonded Silicon–on–Sapphire Wafers and Devices", *Journal of Applied Physics*, 72(6), (Sep. 1992),2526–7.

Jeon, Sanghun, et al., "Ultrathin nitrided–nanolaminate ($Al_2O_3/ZrO_2/Al_2O_3$) for metal–oxide–semiconductor gate dielectric applications", *Journal of Vacuum Science & Technology B: Microelectronics and Nanometer Structures*, 20(3), (May 2002),1143–5.

Jun, Y. K., "The Fabrication and Electrical Properties of Modulated Stacked Capacitor for Advanced DRAM Applications", *IEEE Electron Device Letters*, 13, (Aug. 1992), 430–432.

Jung, T. S., "A 117–mm$^2$ 3.3–V Only 128–Mb Multilevel NAND Flash Memory for Mass Storage Applications", *IEEE Journal of Solid–State Circuits*, 31, (Nov. 1996), 1575–1583.

Jung, H S., et al., "Improved Current Performance of CMOSFETs with Nitrogen Incorporated $HfO_2$–$Al_2O_3$ Laminate Gate Dielectric", *Technical Digest of International Electron Devices Meeting 2002*, (2002),853–856.

Kang, H. K., et al., "Highly Manufacturable Process Technology for Reliable 256 Mbit and 1 Gbit DRAMs", *IEEE International Electron Devices Meeting, Technical Digest*, San Francisco, CA,(Dec. 11–14, 1994),635–638.

Kang, L, et al., "MOSFET devices with polysilicon on single–layer $HfO_2$ high–K dielectrics", *International Electron Devices Meeting 2000. Technical Digest IEDM*, (2000), 35–8.

Kim, Y W., et al., "50nm gate length logic technology with 9–layer Cu interconnects for 90nm node SoC applications", *Technical Digest of International Electron Devices Meeting 2002*, (2002),69–72.

Kim, Y. S., "A Study on Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA,(1996),675–680.

Kishimoto, T., et al., "Well Structures by High–Energy Boron Implantation for Soft–Error Reduction in Dynamic Random Access Memories (DRAMs)", *Japanese Journal of Applied Physics*, 34, (Dec. 1995),6899–6902.

Kohyama, Y., et al., "Buried Bit–Line Cell for 64MB DRAMs", *1990 Symposium on VLSI Technology, Digest of Technical Papers*, Honolulu, HI,(Jun. 4–7, 1990),17–18.

Koshida, N., "Efficient Visible Photoluminescence from Porous Silicon", *Japanese Journal of Applied Physics*, 30, (Jul. 1991),L1221–L1223.

Kuge, S., et al., "SOI–DRAM Circuit Technologies for Low Power High Speed Multigiga Scale Memories", *IEEE Journal of Solid–State Circuits*, 31(4), (Apr. 1996),pp. 586–591.

Lantz, II, L., "Soft Errors Induced By Alpha Particles", *IEEE Transactions on Reliability*, 45, (Jun. 1996),174–179.

Lasky, J. B., "Wafer Bonding for Silicon–on–Insulator Technologies", *Applied Physics Letters*, 48(1), (Jan. 6, 1986), 78–80.

Lee, Byoung H., et al., "Characteristics of TaN gate MOSFET with ultrathin hafnium oxide (8 A–12 A)", *Electron Devices Meeting, 2000. IEDM Technical Digest. International*, (2000),39–42.

Lee, S. J., et al., "Hafnium oxide gate stack prepared by in situ rapid thermal chemical vapor deposition process for advanced gate dielectric", *Journal of Applied Phyics*, 92 (5), (Sep. 1, 2002),2807–09.

Lee, S J., "High Quality Ultra Thin CVD $HfO_2$ Gate Stack With Poly–Si Gate Electrode", *Electron Devices Meeting, 2000. IEDM Technical Digest International*, (2000),31–34.

Lee, Jung–Hyoung, et al., "Mass Production Worthy $HfO_2$–$Al_2O_3$ Laminate Capacitor Technology Using Hf Liquid Precursor for sub–100nm DRAMs", *Electron Devices Meeting, 2002. IEDM '02. Digest International*, (2002), 221–224.

Lee, B. H., et al., "Novel Pattern Transfer Process for Bonded SOI Giga–bit DRAMs", *IEEE International SOI Conference*, Piscataway, NJ,(1996),114–115.

Lehmann, V., "The Physics of Macropore Formation in Low Doped n–Type Silicon", *Journal of the Electrochemical Society*, 140(10), (Oct. 1993),2836–2843.

Lu, D, , "Bonding Silicon Wafers by Use of Electrostatic Fields Followed by Rapid Thermal Heating", *Materials Letters*, 4(11), (Oct. 1986),461–464.

Lu, N., et al., "The SPT Cell—A New Substrate–Plate Trench Cell for DRAMs", *1985 IEEE International Electron Devices Meeting. Technical Digest*, Washington, D.C.,(Dec. 1–4, 1985),771–772.

MacSweeney, D., et al., "Modeling of Lateral Bipolar Devices in a CMOS Process", *IEEE Bipolar Circuits and Technology Meeting*, Minneapolis, MN,(Sep. 1996),27–30.

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI,(Jun. 7–9, 1994),133–134.

Maeda, S., et al., "Impact of a Vertical Phi–Shape Transistor (VPhiT) Cell for 1 Gbit DRAM and Beyond", *IEEE Transactions on Electron Devices*, 42, (Dec. 1995),2117–2123.

Masu, K., et al., "Multilevel Metallization Based on Al CVD", *1996 IEEE Symposium on VLSI Technology. Digest of Technical Papers*, Honolulu, HI,(Jun. 11–13, 1996),44–45.

McCredie, B. D., et al., "Modeling, Measurement, and Simulation of Simultaneous Switching Noise", *IEEE Transactions on Components, Packaging, and Manufacturing Technology—Part B*, 19, (Aug. 1996),461–472.

Muller, D A., "The electronic structure at the atomic scale of ultrathin gate oxides", *Nature*, (Jun. 1999),752–754.

Mumola, P. B., et al., "Recent Advances in Thinning of Bonded SOI Wafers by Plasma Assisted Chemical Etching", *Electrochemical Society Proceedings*, 95–7, (1995),28–32.

Nakamura, et al., "Giga–bit DRAM Cells with Low Capacitance and Low Resistance Bit–Lines on Buried MOSFET's and Capacitors by Using Bonded SOI Technology—Reversed–Stacked–Capacitor (RSTC) Cell–", *Technical Digest—International Electron Devices Meeting*, (1995), 889–892.

Nitayama, A., et al., "High Speed and Compact CMOS Circuits with Multipillar Surrounding Gate Transistors", *IEEE Transactions on Electron Devices*, 36, (Nov. 1989), 2605–2606.

Oh, C B., et al., "Manufacturable embedded CMOS 6T–SRAM technology with high–k gate dielectric device for system–on–chip applications", *Technical Digest of International Electron Devices Meeting 2002*, (2002),423–426.

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA,(1987),59–66.

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA,(1989), 17–25.

Ohno, Y., et al., "Estimation of the Charge Collection for the Soft–Error Immunity by the 3D–Device Simulation and the Quantitative Investigation", *Simulation of Semiconductor Devices and Processes*, 6, (Sep. 1995),302–305.

Oowaki, Y., et al., "New alpha–Particle Induced Soft Error Mechanism in a Three Dimensional Capacitor Cell", *IEICE Transactions on Electronics*, 78–C, (Jul. 1995),845–851.

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, (Nov. 1993),1604–1610.

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C.,(Dec. 8–11, 1991),469–472.

Park, Jaehoo, et al., "Chemical vapor deposition of $HfO_2$ thin films using a novel carbon–free precursor: characterization of the interface with the silicon substrate", *Journal of the Electrochemical Society*, 149(1), (2002),G89–G94.

Park, Byoung K., et al., "Interfacial reaction between chemically vapor–deposited $HfO_2$ thin films and a HF–cleaned Si substrate during film growth and postannealing", *Applied Physics Letters*, 80(13), (Apr. 1, 2002),2368–70.

Parke, S. A., et al., "A High–Performance Lateral Bipolar Transistor Fabricated on SIMOX", *IEEE Electron Device Letters*, 14, (Jan. 1993),33–35.

Pein, H., "A 3–D Sidewall Flash EPROM Cell and Memory Array", *IEEE Transactions on Electron Devices*, 40, (Nov. 1993),2126–2127.

Pein, H., "Performance of the 3–D Pencil Flash EPROM Cell and Memory Array", *IEEE Transactions on Electron Devices*, 42, (Nov., 1995),1982–1991.

Pein, H. B., "Performance of the 3–D Sidewall Flash EPROM Cell", *IEEE International Electron Devices Meeting, Technical Digest*, (1993),11–14.

Rahtu, Antti, et al., "Atomic Layer Deposition if Zirconium Titanium Oxide from Titanium Isopropoxide and Zirconium Chloride", *Chemistry of Materials*, 13(5), (May 2001),1528–1532.

Ramm, J., et al., "Hydrogen cleaning of silicon wafers. Investigation of the wafer surface after plasma treatment", *Thin Solid Films*, 228, (1993),23–26.

Ramo, S., et al., *Fields and Waves in Communication Electronics, Third Edition*, John Wiley & Sons, Inc.,(1994), pp. 428–433.

Rao, K. V., et al., "Trench Capacitor Design Issues in VLSI DRAM Cells", *1986 IEEE International Electron Devices Meeting, Technical Digest*, Los Angeles, CA,(Dec. 7–10, 1986),140–143.

Richardson, W. F., et al., "A Trench Transistor Cross–Point DRAM Cell", *IEEE International Electron Devices Meeting*, Washington, D.C.,(Dec. 1–4, 1985),714–717.

Sagara, K., "A 0.72 $mm^2$ Recessed STC (RSTC) Technology for 256Mbit DRAMs using Quarter–Micron Phase–Shift Lithography", *1992 Symposium on VLSI Technology, Digest of Technical Papers*, Seattle, WA,(Jun. 2–4, 1992),10–11.

Seevinck, E., et al., "Current–Mode Techniques for High–Speed VLSI Circuits with Application to Current Sense Amplifier for CMOS SRAM's", *IEEE Journal of Solid State Circuits*, 26(4), (Apr. 1991),pp. 525–536.

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, (Sep. 1994),1765–1773.

Shah, A. H., et al., "A 4–Mbit DRAM with Trench–Transistor Cell", *IEEE Journal of Solid–State Circuits*, SC–21, (Oct. 1986),618–625.

Shah, A. H., et al., "A 4Mb DRAM with Cross–Point Trench Transistor Cell", *1986 IEEE International Solid–State Circuits Conference, Digest of Technical Papers*, (Feb. 21, 1986),268–269.

Sherony, M. J., "Reduction of Threshold Voltage Sensitivity in SOI MOSFET's", *IEEE Electron Device Letters*, 16, (Mar. 1995),100–102.

Shimbo, M., et al., "Silicon–to–Silicon direct bonding method", *J. Appl. Phys.* vol. 60, No. 8, (Oct. 1986),2987–2989.

Shimomura, K., "A 1V 46ns 16Mb SOI–DRAM with Body Control Technique", *1997 IEEE International Solid–State Circuits Conference, Digest of Technical Papers*, (Feb. 6, 1997),68–69.

Smith, Ryan C., et al., "Chemical Vapour Deposition of the Oxides of Titanium, Zirconium and Hafnium for Use as High–k Materials in Microelectronic Devices. A Carbonfree Precursor for the Synthesis of Hafnium Dioxide", *Advanced Materials for Optics and Electronics*, 10(3–5), (Jun. 29, 2000),105–14.

Stanisic, B. R., et al., "Addressing Noise Decoupling in Mixed–Signal IC's: Power Distribution Design and Cell Customization", *IEEE Journal of Solid–State Circuits*, 30, (Mar. 1995),321–326.

Stathis, J. H., et al., "Reliability Projection for Ultra–Thin Oxides at Low Voltage", *Tech. Dig. International Electron Device Meeting*, (1998),167–9.

Stellwag, T. B., "A Vertically–Integrated GaAs Bipolar DRAM Cell", *IEEE Transactions on Electron Devices*, 38, (Dec. 1991),2704–2705.

Su, D. K., et al., "Experimental Results and Modeling Techniques for Substrate Noise in Mixed–Signal Integrated Circuits", *IEEE Journal of Solid–State Circuits*, 28(4), (Apr. 1993),420–430.

Suma, K. , et al., "An SOI–DRAM with Wide Operating Voltage Range by CMOS/SIMOX Technology", *IEEE Journal of Solid–State Circuits*, 29(11), (Nov. 1994),pp. 1323–1329.

Sunouchi, K. , et al., "A Surrounding Gate Transistor (SGT) Cell for 64/256Mbit DRAMs", *1989 IEEE International Electron Devices Meeting, Technical Digest*, Washington, D.C.,(Dec. 3–6, 1989),23–26.

Sunouchi, K. , et al., "Process Integration for 64M DRAM Using an Asymmetrical Stacked Trench Capacitor (AST) Cell", *1990 IEEE International Electron Devices Meeting*, San Francisco, CA,(Dec. 9–12, 1990),647–650.

Sze, S. M., *In: Physics of Semiconductor Devices, Second Edition*, John Wiley & Sons, New York,(1981),p. 42.

Takai, M. , et al., "Direct Measurement and Improvement of Local Soft Error Susceptibility in Dynamic Random Access Memories", *Nuclear Instruments & Methods in Physics Research*, B–99, (Nov. 7–10, 1994),562–565.

Takato, H. , "High Performance CMOS Surrounding Gate Transistor (SGT) for Ultra High Density LSIs", *IEEE International Electron Devices Meeting, Technical Digest*, (1988),222–225.

Takato, H. , et al., "Impact of Surrounding Gate Transistor (SGT) for Ultra–High Density LSI's", *IEEE Transactions on Electron Devices*, 38, (Mar. 1991),573–578.

Tanabe, N. , et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan,(Jun. 6–8, 1995),123–124.

Tavel, B , et al., "High performance 40 nm nMOSFETs with $HfO_2$ gate dielectric and polysilicon damascene gate", *Technical Digest of International Electron Devices Meetings 2002*, (2002),429–432.

Temmler, D. , "Multilayer Vertical Stacked Capacitors (MVSTC) for 64Mbit and 256Mbit DRAMs", *1991 Symposium on VLSI Technology, Digest of Technical Papers*, Oiso,(May 28–30, 1991),13–14.

Terauchi, M, , "A Surrounding Gate Transistor (SGT) Gain Cell for Ultra High Density DRAMs", *1993 Symposium on VLSI Technology, Digest of Technical Papers*, Kyoto, Japan, (1993),21–22.

Tong, Q. Y., et al., "Hydrophobic Silicon Wafer Bonding", *Applied Physics Letter* 64(5), (Jan. 31, 1994),625–627.

Tsui, P. G., et al., "A Versatile Half–Micron Complementary BiCMOS Technology for Microprocessor–Based Smart Power Applications", *IEEE Transactions on Electron Devices*, 42, (Mar. 1995),564–570.

Verdonckt–Vanderbroek, S. , et al., "High–Gain Lateral Bipolar Action in a MOSFET Structure", *IEEE Transactions on Electron Devices 38*, (Nov. 1991),2487–2496.

Vittal, A. , et al., "Clock Skew Optimization for Ground Bounce Control", *1996 IEEE/ACM International Conference on Computer–Aided Design, Digest of Technical Papers*, San Jose, CA,(Nov. 10–14, 1996),395–399.

Wang, N. , *Digital MOS Integrated Circuits*, Prentice Hall, Inc. , Englewood Cliffs, NJ,(1989),p. 328–333.

Wang, P. W., "Excellent Emission Characteristics of Tunneling Oxides Formed Using Ultrathin Silicon Films for Flash Memory Devices", *Japanese Journal of Applied Physics*, 35, (Jun. 1996),3369–3373.

Watanabe, H. , et al., "A New Cylindrical Capacitor Using Hemispherical Grained Si (HSG–Si) for 256Mb DRAMs", *IEEE International Electron Devices Meeting, Technical Digest*, San Francisco, CA,(Dec. 13–16, 1992),259–262.

Watanabe, S. , et al., "A Novel Circuit Technology with Surrounding Gate Transistors (SGT's) for Ultra High Density DRAMs", *IEEE Journal of Solid–State Circuits*, 30, (Sep. 1995),960–971.

Watanabe, H. , "A Novel Stacked Capacitor with Porous–Si Electrodes for High Density DRAMs", *1993 Symposium on VLSI Technology, Digest of Technical Papers*, Kyoto, Japan, (1993),17–18.

Watanabe, H. , "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan,(1991),478–480.

Watanabe, H. , "Device Application and Structure Observation for Hemispherical–Grained Si", *J. Appl. Phys.*, 71, (Apr. 1992),3538–3543.

Watanabe, H. , "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan,(1992),422–424.

Weldon, M. K., et al., "Physics and Chemistry of Silicon Wafer bonding Investigated by Infrared Absorption Spectroscopy", *Journal of Vacuum Sci. Technology*, B 14(4), c1996 American Vacuum Society,(Jul./Aug. 1996),3095–3106.

Yamada, T. , et al., "A New Cell Structure with a Spread Source/Drain (SSD) MOSFET and a Cylindrical Capacitor for 64–Mb DRAM's", *IEEE Transactions on Electron Devices*, 38, (Nov. 1991),2481–2486.

Yamada, T. , et al., "Spread Source/Drain (SSD) MOSFET Using Selective Silicon Growth for 64Mbit DRAMs", *1989 IEEE International Electron Devices Meeting, Technical Digest*, Washington, D.C.,(Dec. 3–6, 1989),35–38.

Yamamoto, K. , et al., "Effect of Hf metal predeposition on the properties of sputtered HfO2/Hf stacked gate dielectrics", *Applied Physics Letters*, 81(11), (Sep. 9, 2002), 2053–5.

Yeh, Ching–Fa , et al., "The advanced improvement of PN mesa junction diode prepared by silicon–wafer direct bonding", *1991 International Symposium on VLSI Technology, Systems, and Applications, 1991. Proceedings of Technical Paper*, (May 22–24, 1991),136–140.

\* cited by examiner

METHODS, SYSTEMS, AND APPARATUS FOR UNIFORM CHEMICAL-VAPOR DEPOSITIONS

TECHNICAL FIELD

This invention concerns methods of making integrated circuits, particularly layer-formation, such as chemical-vapor deposition.

BACKGROUND OF THE INVENTION

Integrated circuits, the key components in thousands of electronic and computer products, are interconnected networks of electrical components fabricated on a common foundation, or substrate. Fabricators generally build these circuits layer by layer, using techniques, such as deposition, doping, masking, and etching, to form thousands and even millions of microscopic resistors, transistors, and other electrical components on a silicon substrate, known as a wafer. The components are then wired, or interconnected, together to define a specific electric circuit, such as a computer memory.

One common technique for forming layers in an integrated circuit is called chemical vapor deposition. Chemical vapor deposition generally entails placing a substrate in a reaction chamber, heating the substrate to prescribed temperatures, and introducing one or more gases, known as precursor gases, into the chamber to begin a deposition cycle. The precursor gases enter the chamber through a gas-distribution fixture, such as a gas ring or a showerhead, one or more centimeters above the substrate, and descend toward the heated substrate. The gases react with each other and/or the heated substrate, blanketing its surface with a layer of material. An exhaust system then pumps gaseous by-products or leftovers from the reaction out of the chamber through a separate outlet to complete the deposition cycle.

Conventional chemical-vapor-deposition (CVD) systems suffer from at least two problems. First, conventional CVD systems generally form layers that include microscopic hills and valleys and thus have non-uniform thickness. In the past, fabricators have been able to overcome these hills and valleys through use of post-deposition planarization or other compensation techniques. However, escalating demands for greater circuit density, for thinner layers, and for larger substrates make it increasingly difficult, if not completely impractical, to overcome the non-uniform thickness of conventional CVD layers.

Second, some conventional CVD systems are also inefficient and time consuming. One significant factor affecting both CVD efficiency and duration is the size of conventional reaction chambers, which are generally made large to allow a loading mechanism to insert and extract the substrate. Large chambers generally require more gases to be introduced to achieve desired gas concentrations. However, much of this gas is not only unnecessary based on the amount of material deposited, but is typically treated as waste. Moreover, large chambers also take longer to fill up or pump out, prolonging deposition cycles and thus slowing fabrication of integrated circuits.

Accordingly, there is a need for better systems and methods of chemical-vapor deposition.

SUMMARY OF THE INVENTION

To address these and other problems, the present inventor devised new systems, methods, and apparatuses for chemical-vapor deposition. One exemplary chemical-vapor deposition system includes an outer chamber, a substrate holder, and a unique gas-distribution fixture. The fixture includes a gas-distribution surface having holes for dispensing a gas and a gas-confinement member that forms a wall around the holes. In operation, the gas-confinement member engages, or otherwise cooperates with the substrate holder to form an inner chamber within the outer chamber.

The inner chamber has a smaller volume than the outer chamber and thus consumes less gas during the deposition process than would the outer chamber used alone. Also, the smaller chamber volume allows the exhaust system to pump the chamber more quickly, thus increasing the rate of the CVD process. In addition, the exemplary showerhead is made of a material, like silicon, which can be easily passivated to reduce reaction with reactive gases, thus reducing chemical-vapor buildup in the showerhead. Also, the exemplary showerhead includes a configuration of holes that permits uniform gas flow.

DESCRIPTION OF THE PREFERRED EMBODIMENTS following detailed description, which references and incorporates FIGS. 1–4, describes and illustrates specific embodiments of the invention. These embodiments, offered not to limit but only to exemplify and teach the invention, are shown and described in sufficient detail to enable those skilled in the art to make and use the invention. Thus, where appropriate to avoid obscuring the invention, the description may omit certain information known to those of skill in the art.

Figure 1:
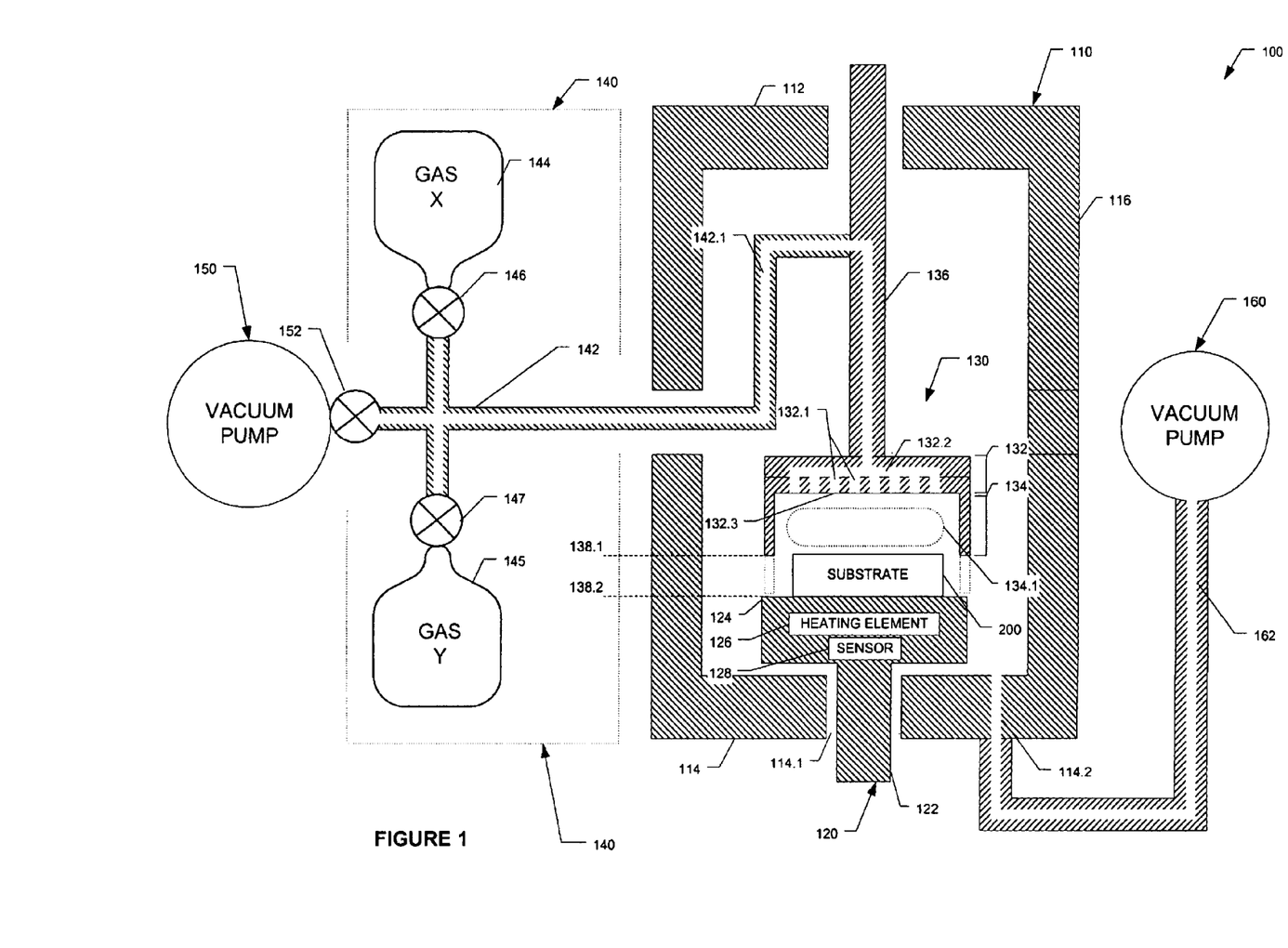
FIG. 1 is a side view of an exemplary deposition reactor according to the invention.

FIG. 1 shows an exemplary chemical-vapor-deposition system 100 which incorporates teachings of the present invention. In particular, system 100 includes a chamber 110, a wafer holder 120, a gas-distribution fixture 130, a gas supply system 140, and exhaust pump 150, and a exhaust pump 160.

More particularly, chamber 110 includes respective top and bottom plates 112 and 114 and a sidewall 116. In the exemplary embodiment, chamber 110 is a cylindrical structure formed of stainless steel or glass. However, other embodiments use different structures and materials. Bottom plate 114 includes an opening 114.1. Extending through opening 114.1 is a stem portion 122 of wafer holder 120.

Wafer holder 120 also includes a support platform 124, one or more heating elements 126, and one or more temperature sensors 128. Support platform 124 supports one or more substrates, wafers, or integrated-circuit assemblies 200. Substrate 200 has an exemplary width or diameter of about 30 centimeters and an exemplary thickness in the range of 850–1000 microns. (The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.) Heating elements 126 and temperature sensors 128 are used for heating substrates 200 to a desired temperature. Holder 120 is coupled to a power supply and temperature control circuitry (both of which are not shown.) In the exemplary embodiment, wafer holder 120 is rotatable either manually or automatically and raises via manual or automatic lever mechanism (not shown). Above wafer holder 120 and substrate 200 is gas-distribution fixture 130.

Fixture 130 includes a gas-distribution member 132, a surface-projection (or gas-confinement) member 134, and a gas inlet 136. Gas inlet 132 couples to gas-supply, gas-distribution channels 134, and a gas inlet 136. In the exemplary embodiment, fixture 130 has two operating positions 138.1 and 138.2 relative support platform 124. Fixture 130 takes operating position 138.1, before and after depositions and operating position 138.2 during depositions.

Gas-distribution member 132 includes gas-distribution holes, or orifices, 132.1 and gas-distribution channels 132.2. Holes 132.1 define a gas-distribution surface 132.3. In the exemplary embodiment, holes 132.1 are substantially circular with a common diameter in the range of 15–20 microns; gas-distribution channels 132.2 have a common width in the range of 20–45 microns; and surface 132.3 is substantially planar and parallel to support platform 124 of wafer holder 120. However, other embodiments use other surface forms as well as shapes and sizes of holes and channels. The distribution and size of holes may also affect deposition thickness and thus might be used to assist thickness control. Holes 132.1 are coupled through gas-distribution channels 132.2 to gas inlet 136.

Surface-projection member 134 projects or extends from surface 132.3 toward support platform 124, defining a fixture cavity 134.1. The exemplary embodiment forms surface-projection member 134 from stainless steel as a uniform annular or circular wall or collar that projects perpendicularly from surface 132 to define a right-cylindrical cavity. However, in some other embodiments, surface-projection member 134 consists essentially of a material different from that of the gas-distribution surface. Additionally, some other embodiments form member 134 to project at other angles relative surface 132.3. For example, some form the projection at an acute or obtuse angle, such as 45 or 135 degrees, and others form the projection to peripherally define an oval, ellipse, triangle, square, or any desirable regular or irregular polygon. Thus, the present invention encompasses a wide variety of projection shapes and configurations, indeed any projection shape that facilitates definition of an effective cavity or gas-confinement volume in cooperation with wafer holder 120 and/or substrate 200.

Figure 2:
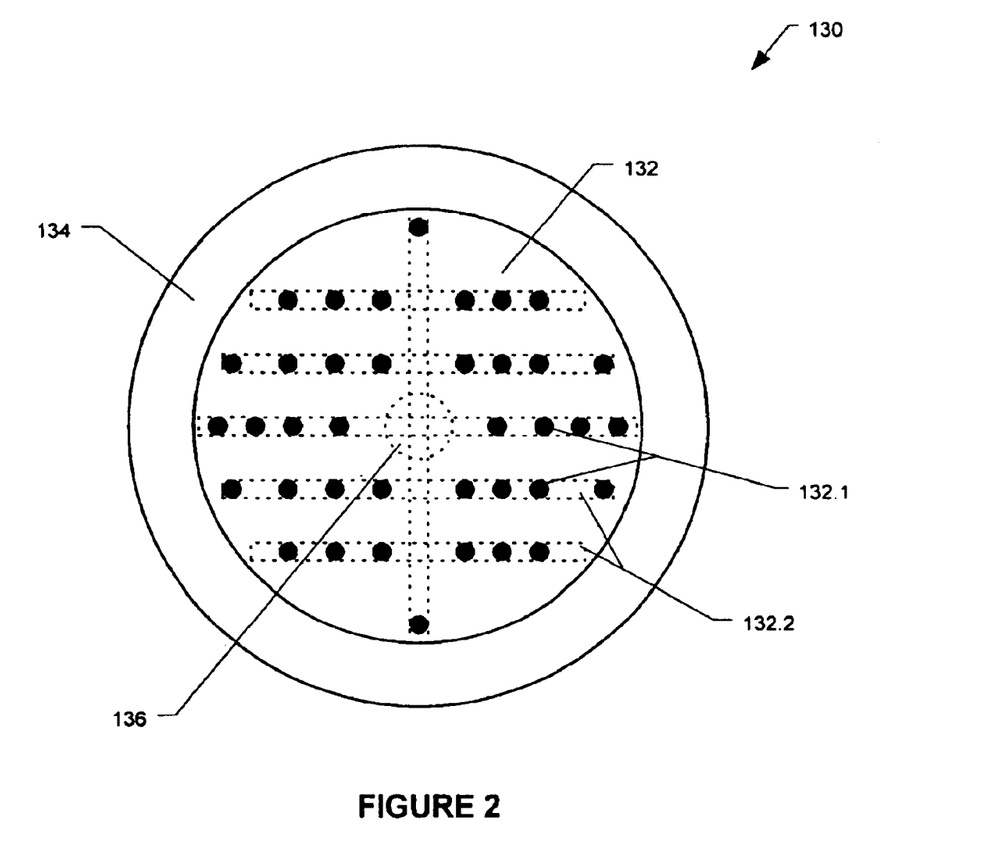
FIG. 2 is a top view of an exemplary gas-distribution fixture according to the invention.

FIG. 2, a plan view, shows further details of the exemplary embodiment of gas-distribution fixture 130. In particular, the plan view shows not only exemplary circular peripheries of gas-distribution member 132 and surface-projection member 134, but also an exemplary distribution pattern for holes 132.1 and an exemplary orthogonal arrangement of gas-distribution channels 132.2. Other embodiments, however, use other hole distribution patterns and channel arrangements. For example, some embodiments include random or concentric hole patterns and various channel geometries, including concentric circles, rectangles, or other regular or irregular concentric polygons. Some embodiments may also dedicate various subsets of channels and corresponding holes to different gases.

Gas-distribution member 132 can be made in a number of ways. One exemplary method entails providing two wafers of materials, such as silicon or other passivatable, inert, or non-reactive material. One wafer is patterned and etched, for example, using conventional photolithographic or micro-electro-mechanical systems (MEMS) technology, to form a pattern holes, and the other wafer is patterned and etched to include a complementary or corresponding pattern of gas-distribution channels. (MEMS refers to the technologies of making structures and devices with micrometer dimensions.) Dry-etching techniques produce small openings and channels, while wet etching produces larger openings and channels. For further details, see, for example, M. Engelhardt, "Modern Application of Plasma Etching and Patterning in Silicon Process Technology," Contrib. Plasma Physics, vol. 39, no. 5, pp. 473–478 (1999).

The two wafers are then bonded together with the holes and channels in appropriate alignment using known wafer-bonding techniques. See, for example, G. Krauter et al., "Room Temperature Silicon Wafer Bonding with Ultra-Thin Polymer Films," Advanced Materials, vol. 9, no. 5, pp. 417–420 (1997); C. E. Hunt et al., "Direct Bonding of Micromachined Silicon Wafers for Laser Diode Heat Exchanger Applications," J. Micromech. Microeng, vol. 1, pp. 152–156 (1991); Zucker, O. et al., "Applications of oxygen plasma processing to silicon direct bonding," Sensors and Actuators, A. Physical, vol. 36, no. 3, pp. 227–231 (1993), which are all incorporated herein by reference. See also, copending and co-assigned U.S. patent application Ser. No. 09/189,276 (dockets 303.534US1 and 97-1468) entitled "Low Temperature Silicon Wafer Bond Process with Bulk Material Bond Strength," which was filed Nov. 10, 1998 and which is also incorporated herein by reference. The resulting bonded structure is then passivated using thermal oxidation for example, yielding a surface portion of gas-distribution member 132 that consists essentially of silicon and silicon oxide.

For an alternative fixture structure and manufacturing method that can be combined with those of the exemplary embodiment, see U.S. Pat. No. 5,595,606, entitled "Shower Head and Film Forming Apparatus Using Same, which is incorporated herein by reference. In particular, one embodiment based on this patent adds a projection or gas-confinement member to the reported showerhead structure.

FIG. 1 also shows that gas inlet 136 couples gas-distribution fixture 130 to gas-supply system 140. Gas-supply system 140 includes a gas line 142, gas sources 144 and 145, and mass-flow controllers 146 and 147. Gas line or conduit 142, which includes a flexible portion 142.1, passes through an opening 116.1 in chamber sidewall 116 to connect with gas inlet 136. Gas source 144 is coupled via mass-flow controller 146 to gas line 142, and gas source 147 is coupled via mass-flow controller 147 to gas line 142. The exemplary embodiment provides computer-controlled thermal or pressure-based mass-flow controllers; however, the invention is not limited to any particular number or type of mass-flow controller, nor to any particular number or set of gas sources.

System 100 also includes vacuum pumps 150 and 160. Vacuum pump 150 is coupled to gas-distribution fixture 130 via a mass-flow controller 152 and gas line 142. And, vacuum pump 160 is coupled to the interior of chamber 110 via a line 162 and an opening 114.2 in chamber bottom plate 114. In the exemplary embodiment, vacuum pump 160 has a greater capacity than vacuum pump 150.

In general operation, system 100 functions, via manual or automatic control, to move gas-distribution fixture 130 from operating position 138.1 to position 138.2, to introduce reactant gases through fixture 130 onto substrate 200, and to deposit desired matter through chemical-vapor deposition onto the substrate. After the desired matter is deposited, pump 150 evacuates gases through fixture 130.

Figure 3:
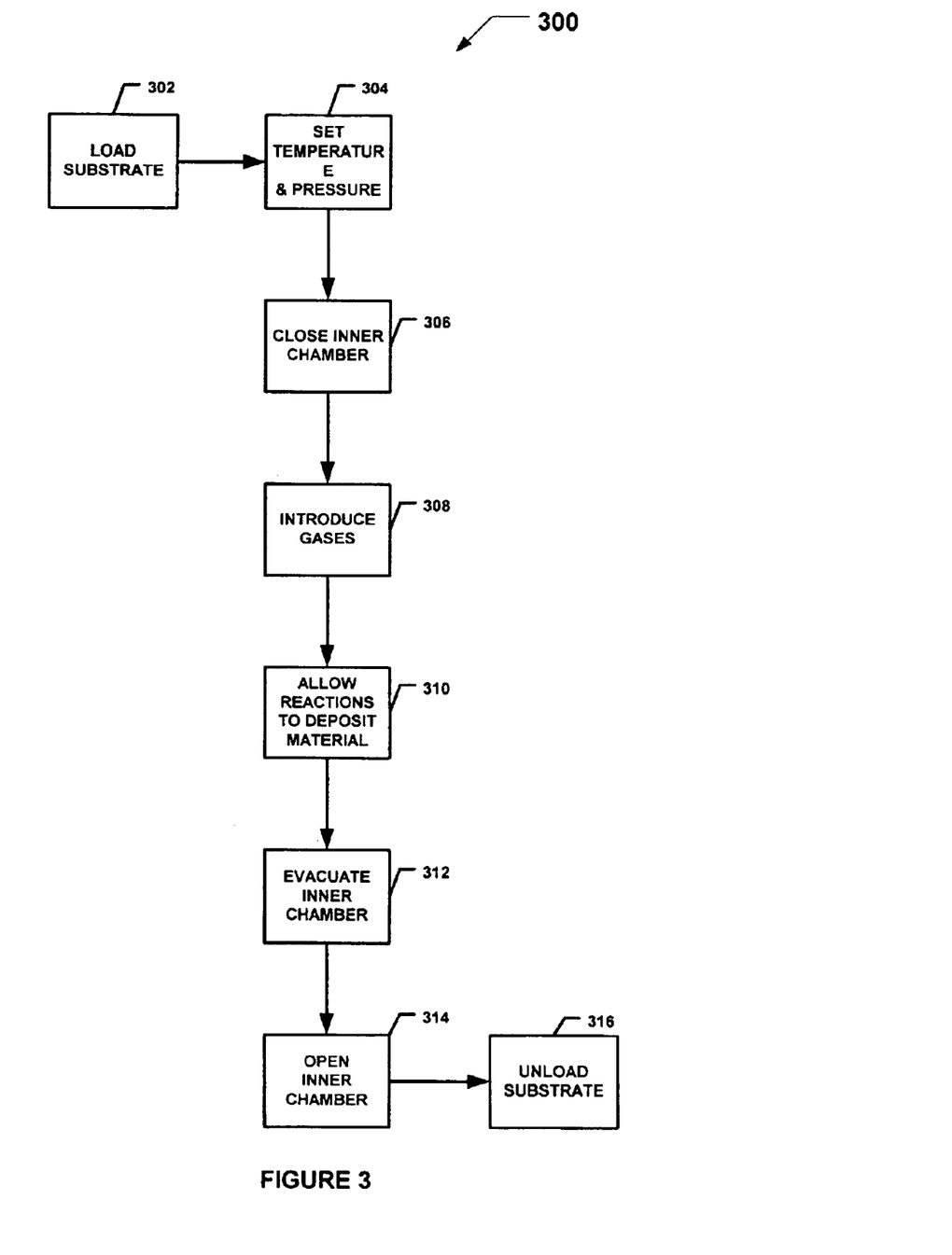
FIG. 3 is a flowchart showing an exemplary method according to the invention.

More particularly, FIG. 3 shows a flowchart 300 which illustrates an exemplary method of operating system 100. Flowchart 300 includes process blocks 202–216.

The exemplary method begins at block 302 with insertion of substrate 300 onto wafer holder 120. Execution then proceeds to block 304.

Block 304 establishes desired temperature and pressure conditions within chamber 110. In the exemplary embodiment, this entails operating heating element 126 to heat substrate 200 to a desired temperature, and operating vacuum pump 160 to establish a desired pressure. Temperature and pressure are selected based on a number of factors, including composition of the substrate and reactant gases, as well as the desired reaction. After establishing these deposition conditions, execution continues at block 306.

In block 306, the system forms or closes an inner chamber around substrate 200, or more precisely a portion of substrate 200 targeted for deposition. In the exemplary embodiment, this entails using a lever or other actuation mechanism (not shown) to move gas-distribution fixture 130 from position 138.1 to position 138.2 or to move wafer holder 120 from position 138.2 to 138.1. In either case, this movement places gas-distribution surface 132.3 one-to-five millimeters from an upper most surface of substrate 200. In this exemplary position, a lower-most surface of surface-projection member 134 contacts the upper surface of support platform 124, with the inner chamber bounded by gas-distribution surface 132.3, surface-projection member 134, and the upper surface of support platform 124.

Other embodiments define in the inner chamber in other ways. For example, some embodiments include a surface-projection member on support platform 124 of wafer holder 120 to define a cavity analogous in structure and/or function to cavity 134.1. In these embodiments, the surface-projection member takes the form of a vertical or slanted or curved wall, that extends from support platform 124 and completely around substrate 200, and the gas-distribution fixture omits a surface-projection member. However, some embodiments include one or more surface-projection members on the gas-distribution fixture and the on the support platform, with the projection members on the fixture mating, engaging, or otherwise cooperating with those on the support platform to define a substantially or effectively closed chamber. In other words, the inner chamber need not be completely closed, but only sufficiently closed to facilitate a desired deposition.

After forming the inner chamber, the exemplary method continues at block 308. Block 308 entails introducing one or more reactant or precursor gases into the separate chamber. To this end, the exemplary embodiment operates one or more mass-flow controllers, such as controllers 146 and 147, to transfer gases in controlled quantities and temporal sequences from gas sources, such as sources 144 and 147, through gas line 142 and fixture 130 into the separate chamber.

Notably, the inner chamber is smaller in volume than chamber 100 and thus requires less gas and less fill time to achieve desired chemical concentrations (assuming all other factors equal.) More precisely, the exemplary embodiment provides an inner chamber with an empty volume in the range of 70 to 350 cubic centimeters, based on a 1-to-5 millimeter inner-chamber height and a fixture with a 30-centimeter diameter. Additionally, the number and arrangement of holes in the fixture as well as the placement of the holes close to the substrate, for example within five millimeters of the substrate, promote normal gas incidence and uniform distribution of gases over the targeted portion of substrate 200.

Block 310 entails allowing the gases to react with each other and/or the heated substrate to deposit a layer of material on targeted portions of the substrate. It is expected that the resulting layer will exhibit a highly uniform thickness across the entire substrate because of the more uniform gas distribution.

Next, as block 312 shows, the exemplary method entails evacuating gaseous waste or by-products produced during the deposition. To this end, the exemplary embodiment, activates vacuum pump 160 to pump gaseous waste from the inner chamber through gas-distribution fixture 130. In some embodiments, pumps 150 and 160 are operated concurrently to establish initial pressure conditions and to evacuate the inner and outer chambers after deposition.

In block 314, the system opens the separate chamber. In the exemplary embodiment, this entails automatically or manually moving gas-distribution fixture 130 to position 138.1. Other embodiments, however, move the wafer holder or both the fixture and the wafer holder. Still other embodiments may use multipart collar or gas-confinement members which are moved laterally relative the wafer holder or gas-distribution fixture to open and close an inner chamber.

In block 316, substrate 200 is unloaded from chamber 110. Some embodiments remove the substrate manually, and others remove it using an automated wafer transport system.

Figure 4:
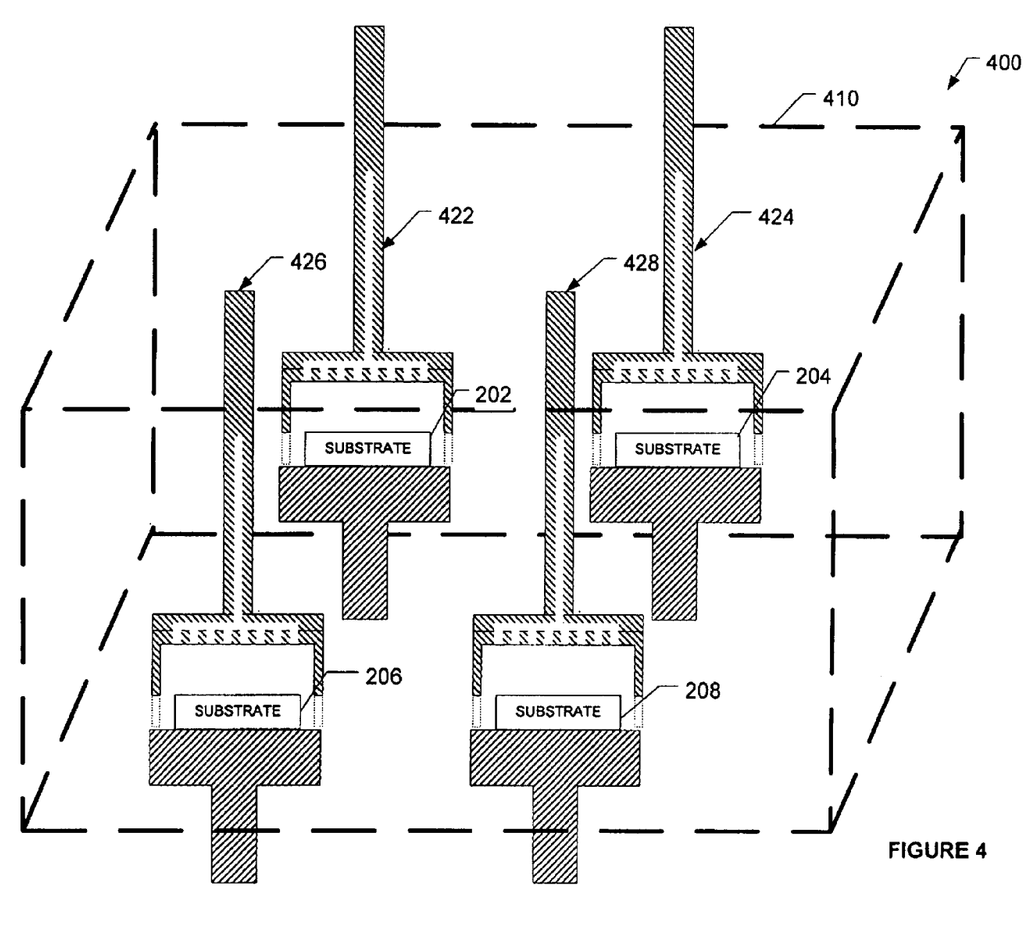
FIG. 4 is a diagram of an exemplary deposition system 400 incorporating a set of four deposition stations similar in structure and function to system 100 of FIG. 1.

FIG. 4 shows a conceptual representation of another exemplary chemical-vapor-deposition system 400 incorporating teachings of the present invention. System 400 includes a rectangular outer chamber 410 which encloses four deposition stations 420, 422, 424, and 426, loaded with respective substrates 200, 202, 204, and 206. Although the figure omits numerous components for clarity, each deposition station is structurally and operationally analogous to system 100 in FIG. 1. In the exemplary embodiment, two or more of the stations are operated in parallel. Additionally, other embodiments of this multi-station system arrange the stations in a cross formation, with each station confronting a respective lateral face of the chamber. Still other embodiments use different outer chamber geometries, for example cylindrical or spherical.

CONCLUSION

In furtherance of the art, the inventor has presented new systems, methods, and apparatuses for chemical-vapor deposition. One exemplary system includes an outer chamber, a substrate holder, and a unique gas-distribution fixture. The fixture includes a gas-distribution surface having holes for dispensing a gas and a gas-confinement member that engages, or otherwise cooperates with the substrate holder to form an inner chamber within the outer chamber.

Notably, the inner chamber not only consumes less gas during deposition to reduce deposition waste and cost, but also facilitates rapid filling and evacuation to reduce deposition cycle times (with all other factors being equal.) The inner chamber also places the gas-distribution fixture within several millimeters of a substrate on the substrate holder, promoting normal gas incidence across the chamber and thus uniform deposition thickness.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. A chemical-vapor-deposition system comprising:
    a first chamber;
    a gas-distribution fixture in the first chamber, the fixture including a gas-distribution surface having a plurality of holes and a gas-confinement member extending from the gas-distribution surface around the plurality of holes, and the fixture being movable from at least a first operating position to a second operating position; and
    a wafer holder having a wafer-support surface confronting the gas-distribution surface.

2. The system of claim 1, wherein the gas-confinement member comprises extends perpendicularly from the gas-distribution surface.

3. The system of claim 1, wherein the wafer-support surface is substantially parallel to the gas-distribution surface.

4. The system of claim 1, wherein the gas-confinement member surrounds all the holes.

5. The system of claim 1, wherein the gas-confinement member consists essentially of a material different from that of the gas-distribution surface.

6. The system of claim 1, wherein the gas-distribution surface is substantially planar and comprises silicon and silicon oxide.

7. The system of claim 1, wherein at the second operating position the fixture defines a second chamber within the first chamber, with the second chamber sized to contain a wafer having a 300-millimeter width or diameter.

8. The system of claim 1, wherein at the second operating position the gas-confinement member contacts the wafer support surface and the fixture defines a second chamber within the first chamber, with the second chamber sized to contain a wafer having a 300-millimeter width or diameter and to define a volume in the range of 70–350 cubic centimeters.

9. The system of claim 1, wherein the second operating position is for placing the gas-distribution surface in the range of 1–5 millimeters from an uppermost surface of a wafer on the wafer-support surface.

10. The system of claim 1, wherein each of the holes has a nominal width or diameter in the range of 15–20 microns.

11. The system of claim 1, wherein the gas-confinement member extends from the gas-distribution surface to define an acute or obtuse angle.

12. A chemical-vapor-deposition system comprising:
    a first chamber;
    a gas-distribution fixture in the first chamber, the fixture movable from at least a first operating position to a second operating position and including:
        a gas-distribution member comprising:
            a first plate having one or more gas-distribution channels; and
            a second plate adjacent the first plate and having a plurality of holes that define a gas-distribution surface; and
        a gas-confinement member extending from the gas-distribution surface around the plurality of holes; and
    a wafer holder having a wafer-support surface confronting the gas-distribution surface.

13. The system of claim 12, wherein the first and second plates each consist essentially of silicon and silicon oxide.

14. The system of claim 12, wherein the first and second plates are bonded to each other.

15. The system of claim 14:
    wherein at the second operating position, the gas-confinement member contacts the wafer support surface and the fixture defines a second chamber within the first chamber, with the second chamber sized to contain a wafer having a 300-millimeter width or diameter and to define a volume in the range of 70–350 cubic centimeters; and
    wherein the system further comprises a first pump coupled to evacuate the first chamber and a second pump coupled to evacuate the second chamber through the gas-distribution fixture.

16. The system of claim 12, wherein the gas-confinement member extends perpendicularly from the gas-distribution surface.

17. The system of claim 12, wherein the wafer support surface is substantially parallel to the second plate.

18. The system of claim 12, wherein the gas-confinement member surrounds all the holes.

19. The system of claim 12, wherein the gas-confinement member consists essentially of a material different from that of the gas-distribution surface.

20. The system of claim 12, wherein the gas-distribution surface is substantially planar and comprises silicon.

21. The system of claim 12, wherein the first and second plates including respective first and second major surfaces that are in contact with each other.

22. The system of claim 12, further comprising a bond between the first and second plates.

23. A chemical-vapor-deposition system comprising:
    a first chamber having an interior sidewall; and
    a second chamber within the first chamber, the second chamber including:
        a gas-distribution member having a plurality of holes that define a gas-distribution surface; and
        a gas-confinement surface partly enclosing the plurality of holes, the gas-confinement surface spaced from the interior sidewall of the first chamber, nonparallel to the gas-distribution surface, and movable in unison with the gas-distribution member from a first to a second operating position; and
        a wafer-support surface confronting the gas-distribution surface.

24. The system of claim 23, wherein the gas-distribution member comprises first and second non-metal plates, with the first plate including the plurality of holes and the second plate including one or more channels for providing fluid communication with one or more of the holes.

25. The system of claim 24, wherein the wafer support surface is substantially parallel to the second plate.

26. The system of claim 23, wherein the gas-confinement surface is substantially perpendicular to the gas-distribution surface.

27. The system of claim 23, wherein the gas-confinement surface consists essentially of a material different from that of the gas-distribution surface.

28. The system of claim 23, wherein the gas-distribution surface is substantially planar and comprises silicon.

29. The system of claim 23, wherein the first and second plates consist essentially of silicon and a silicon oxide.

30. The system of claim 23, wherein two or more of the gas-distribution channels are perpendicular to each other.

31. The system of claim 23, further comprising:
    a first pump coupled to evacuate the first chamber; and a second pump coupled to evacuate the second chamber through the gas-distribution fixture.

32. A chemical-vapor deposition system comprising:

first means for confining one or more gases;

second means for confining one or more gases, the first means at least partly contained within the first means and movable from a first operating position to a second operating position.

33. The system of claim 32, further comprising:

a first pump for evacuating the first means; and a second pump coupled to evacuate the second means.

34. A gas-distribution fixture for a chemical-vapor-deposition system, the fixture comprising:

a first non-metallic plate including one or more gas-distribution channels for coupling to a gas source;

a second non-metallic plate including one or more gas-distribution holes in fluid communication with the gas-distribution channels of the first plate; and a gas-confinement wall extending outward relative to the gas-distribution surface and surrounding the one or more gas-distribution holes.

35. The fixture of claim 34, wherein the gas-confinement wall is perpendicular to the gas-distribution surface.

36. The fixture of claim 34, wherein the gas-confinement wall consists essentially of a material that is different from that of the second non-metallic plate.

37. The fixture of claim 34, wherein the gas-confinement wall consists essentially of a stainless steel and the first and second non-metallic plates each consist essentially of silicon.

38. The fixture of claim 34, wherein each of the holes has a nominal width or diameter in the range of 15–20 microns.

39. The fixture of claim 38, wherein each of the channels has a nominal width in the range of 20–45 microns.

40. A gas-distribution fixture for use in a chemical-vapor-deposition chamber having a first volume, the fixture comprising:

means for distributing gas in at least a first dimension across a surface within the chamber, with the means for distributing gas movable from a first operating position to a second operating position; and means for at least partly confining the distributed gas to a second volume which is less than the first volume.

41. The gas-distribution fixture of claim 40, wherein the means for distributing gas consists essentially of a non-reactive material.

42. The gas-distribution fixture of claim 40, wherein the means for distributing gas includes a plurality of holes and the means for at least partly confining the distributed gas encompasses the plurality of holes.

43. A chemical-vapor-deposition system comprising:

a first chamber;

a gas-distribution fixture in the first chamber, the fixture including a gas-distribution surface having a plurality of holes and a gas-confinement member extending from the gas-distribution surface around the plurality of holes, and the fixture being movable from at least a first operating position to a second operating position;

a wafer holder having a wafer-support surface confronting the gas-distribution surface, wherein at the second operating position, the gas-distribution surface, the gas-confinement member, and the wafer-support surface defines a second chamber within the first chamber;

a first pump coupled to evacuate the first chamber; and a second pump coupled to evacuate the second chamber through the gas-distribution fixture.

44. The system of claim 43, wherein the second chamber is sized to contain a wafer having a 300-millimeter width or diameter and to define a volume in the range of 70–350 cubic centimeters.

45. The system of claim 43, wherein the second operating position is for placing the gas-distribution surface in the range of 1–5 millimeters from an uppermost surface of a wafer on the wafer-support surface.

46. The system of claim 43, wherein each of the holes has a nominal width or diameter in the range of 15–20 microns.

47. The system of claim 43, wherein the first pump has a greater capacity than the second pump.

* * * * *

UNITED STATES PATENT AND TRADEMARK OFFICE
CERTIFICATE OF CORRECTION

PATENT NO.     : 6,852,167 B2
DATED          : February 8, 2005
INVENTOR(S)    : Ahn

It is certified that error appears in the above-identified patent and that said Letters Patent is hereby corrected as shown below:

Column 2,
Line 36, insert -- The -- before "following".

Column 7,
Line 18, after "member" delete "comprises".

Signed and Sealed this

Twelfth Day of July, 2005

JON W. DUDAS
*Director of the United States Patent and Trademark Office*